United States Patent
Houis

(10) Patent No.: US 11,747,369 B2
(45) Date of Patent: Sep. 5, 2023

(54) CURRENT SENSOR AND METHOD

(71) Applicant: Melexis Technologies SA, Bevaix (CH)

(72) Inventor: Simon Houis, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 35 days.

(21) Appl. No.: 17/372,101

(22) Filed: Jul. 9, 2021

(65) Prior Publication Data
US 2022/0018880 A1   Jan. 20, 2022

(30) Foreign Application Priority Data

Jul. 16, 2020   (EP) .................................... 20186347

(51) Int. Cl.
*G01R 19/00*   (2006.01)
*G01R 15/20*   (2006.01)

(52) U.S. Cl.
CPC .......... *G01R 15/207* (2013.01); *G01R 15/202* (2013.01); *G01R 19/0092* (2013.01)

(58) Field of Classification Search
CPC .... G01R 15/207; G01R 15/202; G01R 19/10; G01R 19/0092; G01R 15/20
See application file for complete search history.

(56) References Cited

U.S. PATENT DOCUMENTS

| | | | |
|---|---|---|---|
| 2007/0080676 A1 | 4/2007 | Racz et al. | |
| 2011/0221429 A1* | 9/2011 | Tamura | G01R 15/207 324/244 |
| 2011/0270553 A1 | 11/2011 | Ausserlechner et al. | |
| 2012/0081110 A1 | 4/2012 | Racz | |
| 2015/0323568 A1* | 11/2015 | Schmitt | G01R 19/0092 324/126 |
| 2016/0223594 A1 | 8/2016 | Suzuki et al. | |
| 2020/0011902 A1 | 1/2020 | Shimizu | |
| 2020/0381881 A1* | 12/2020 | Ortner | G01R 15/202 |

FOREIGN PATENT DOCUMENTS

| | | |
|---|---|---|
| EP | 3109658 A1 | 12/2016 |
| JP | 2012058150 A | 3/2012 |
| JP | 6256819 B2 | 1/2018 |

OTHER PUBLICATIONS

Extended Search Report from corresponding EP Application No. EP20186347.9, dated Dec. 14, 2020.

* cited by examiner

*Primary Examiner* — Dominic E Hawkins
(74) *Attorney, Agent, or Firm* — WORKMAN NYDEGGER

(57) ABSTRACT

A current sensor arrangement for measuring an AC electrical current, comprising: an electrical conductor having three transverse rectangular cut-outs; a sensor device comprising two sensor elements spaced apart along a first direction for measuring two magnetic field components oriented in said first direction, and configured for determining a magnetic field difference or magnetic field gradient, and for determining the AC current based on said difference or gradient. The sensor device is positioned at a particular location relative to the second cut-out, such that the magnetic field difference or gradient is substantially proportional to the AC current for frequencies from 100 Hz to 2 kHz. A current sensor system. A method of measuring an AC current with improved accuracy.

20 Claims, 15 Drawing Sheets

FIG. 1(a)
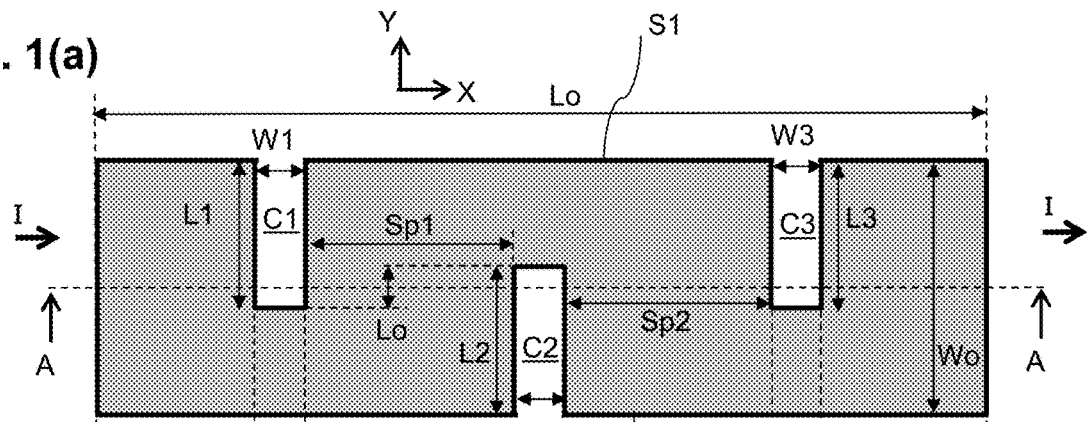
FIG. 1(b)
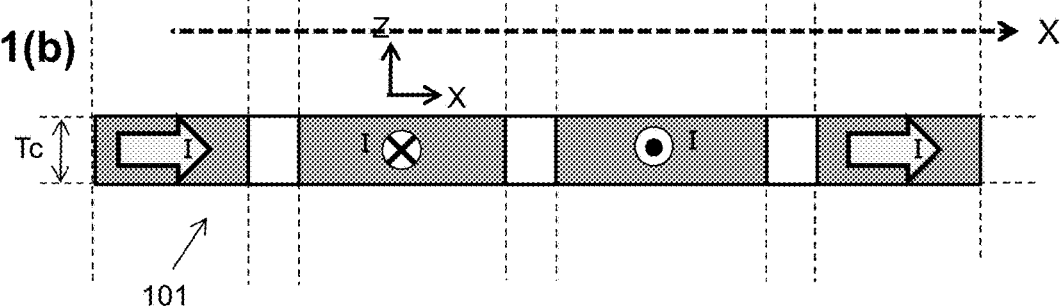
FIG. 1(c)
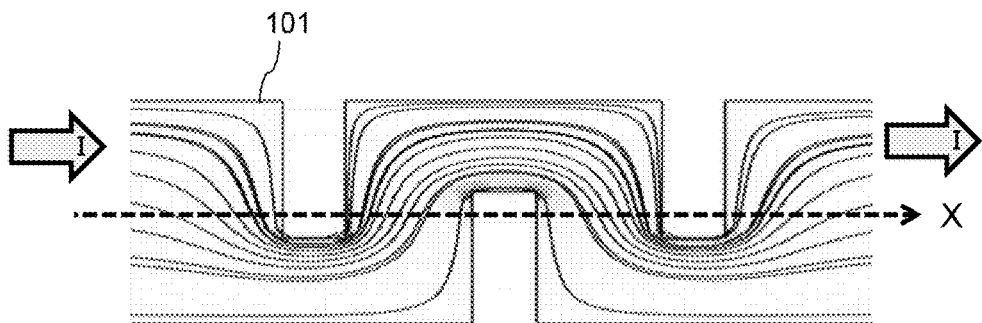
FIG 1

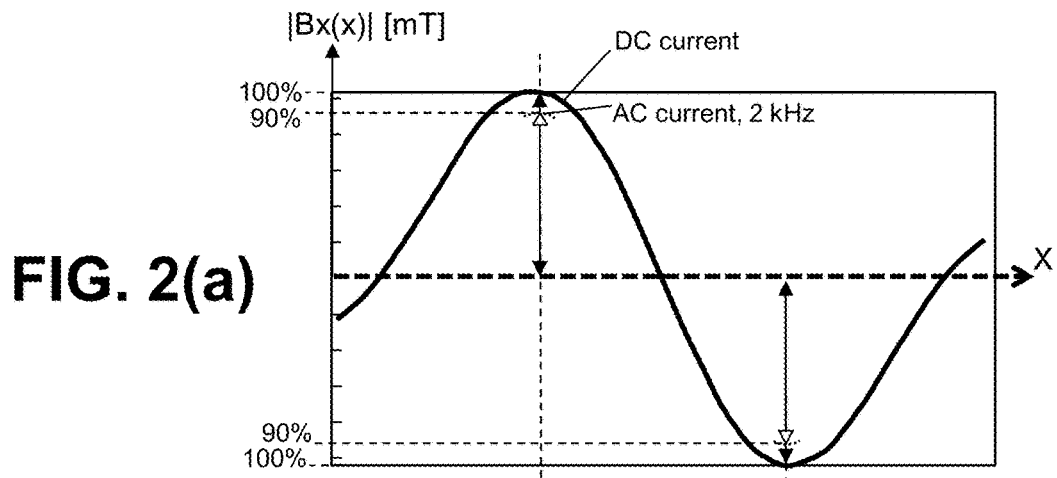
FIG. 2(a)
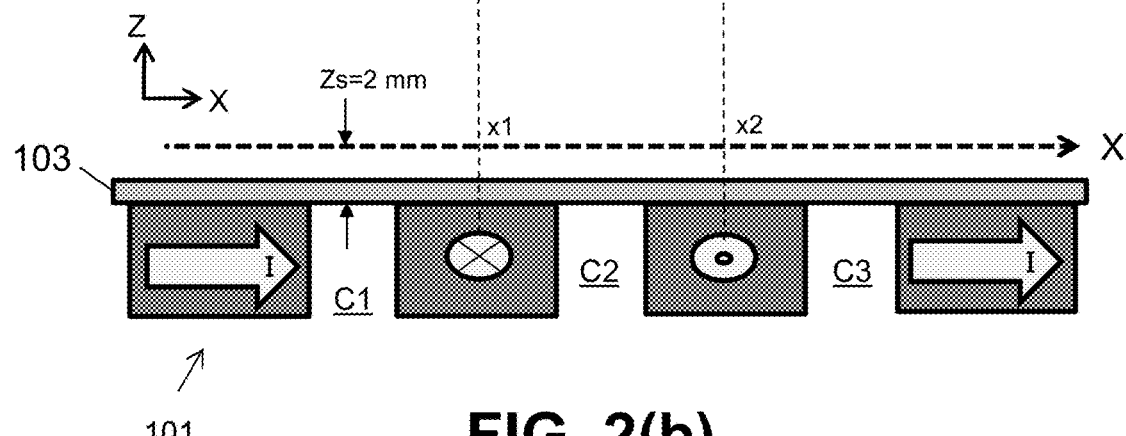
FIG. 2(b)
FIG 2

FIG. 8(a)
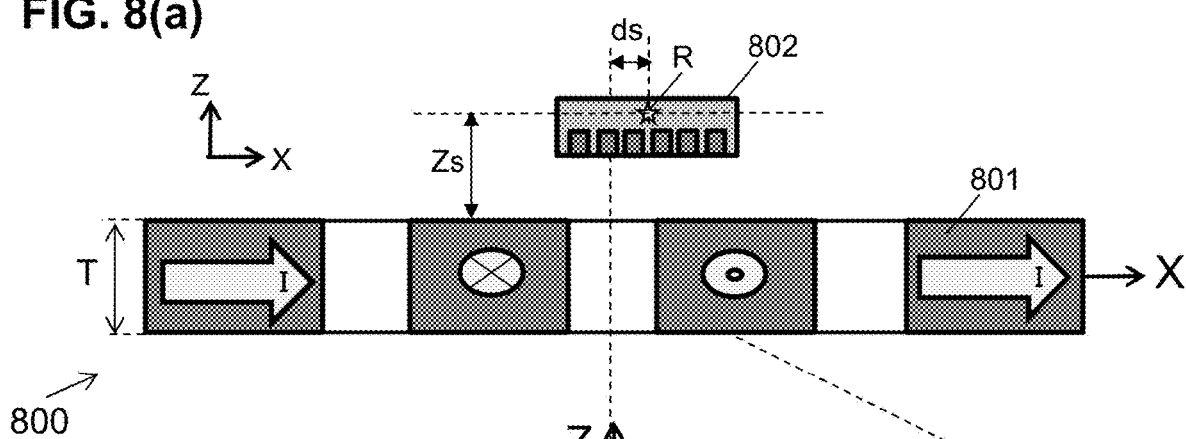
FIG. 8(b)
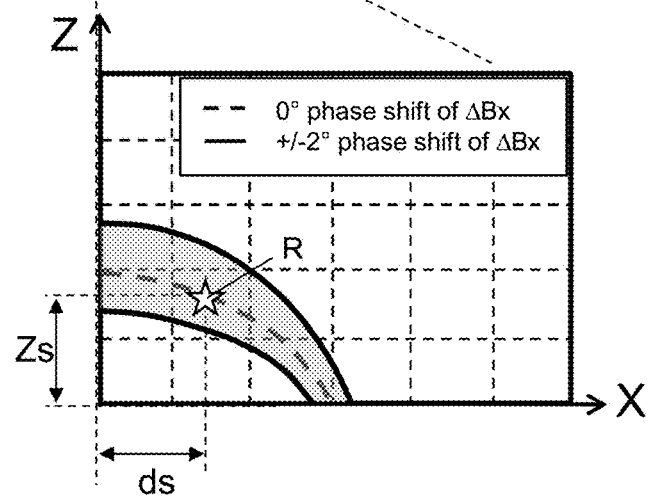
FIG 8

CURRENT SENSOR AND METHOD

FIELD OF THE INVENTION

The present invention relates in general to the field of current sensors, and more in particular to magnetic current sensors, and methods of measuring a current.

BACKGROUND OF THE INVENTION

Different kinds of current sensors are known in the art, for example (1) current sensors using a shunt resistor, (2) using a current transformer, (3) or using a magnetic sensor.

In current sensors using a shunt resistor, a voltage is measured over the shunt resistor, and the current value can be determined by dividing the measured voltage value and the resistor value. A disadvantage of this type is that the measurement circuit is not electrically isolated from the load. A current transformer includes primary and secondary coils. While this type of current sensor provides galvanic separation, it is usually very bulky. Current sensors based on magnetic sensors provide both galvanic separation and can be very compact.

Known current sensors are typically designed to measure DC currents or low frequency currents, for example currents having a frequency of about 50 Hz or about 60 Hz.

Various electrical motor types exist, for example: so called DC brushed motors, DC brushless motors, AC brushless motors, linear motors, stepper motors, etc. In electrical vehicles, the following motor types are typically used: DC Series Motor, Brushless DC Motor, Permanent Magnet Synchronous Motor (PMSM), Three Phase AC Induction Motors, Switched Reluctance Motors (SRM).

Various electrical circuits for driving and/or controlling and/or monitoring electrical motors exist. In some of these circuits the actual currents provided to the motor need to be measured. These currents may have a magnitude of several tens or even hundreds of Amperes, and may have a frequency or frequency components up to several kHz. These currents are typically provided to the motor via so called "busbars". Busbars often come in the form of a metallic strip or bar, for example a copper bar.

It is known that, when an AC current flows through an electrical conductor, a phenomenon known as "skin effect" will occur. This causes the effective electrical resistance of the electrical conductor to increase. The higher the frequency of the electrical current, the higher the effective resistance of the electrical conductor.

It is a challenge to measure an AC current with high accuracy.

SUMMARY OF THE INVENTION

It is an object of embodiments of the present invention to provide a current sensor arrangement and a method for measuring an AC current, for example an AC current flowing through a busbar.

It is an object of embodiments of the present invention to provide a current sensor arrangement and a method of measuring an AC current with improved accuracy.

It is an object of embodiments of the present invention to provide a current sensor arrangement and a method of measuring an AC current with improved accuracy, for AC current having a sinusoidal waveform with a slowly variable frequency in the range from 100 Hz to 2000 Hz.

It is an object of embodiments of the present invention to provide a current sensor arrangement and a method of measuring an AC current with improved accuracy, not only for sinusoidal waveforms, but also for non-sinusoidal waveforms having more than one frequency in the range from about 100 Hz to about 2000 Hz.

It is an object of embodiments of the present invention to provide a current sensor arrangement and a method of measuring an AC current with improved accuracy, in a simple manner.

It is an object of embodiments of the present invention to provide a current sensor arrangement and a method for measuring an AC current having a frequency or having frequencies in the range from about 100 Hz to about 2000 Hz.

It is an object of embodiments of the present invention to provide a current sensor arrangement and a method of measuring an AC current having a frequency or having multiple frequencies in the range from about 100 Hz to about 2000 Hz with an absolute accuracy of about +/−5%, or +/−4%, or +/−3%, or +/−2%, or +/−1%, or less.

These and other objects are accomplished by a current sensor arrangement and a method according to embodiments of the present invention.

According to a first aspect, the present invention provides a current sensor arrangement for measuring an AC electrical current, comprising: an electrical conductor having an overall elongated shape extending in a first direction, and having a predefined overall width in a second direction, and a predefined thickness in a third direction; a sensor device comprising two sensor elements spaced apart by a predefined distance along the first direction, each sensor element configured for measuring a magnetic field component oriented in the first direction; and wherein the sensor device is configured for determining a magnetic field difference or a magnetic field gradient along the first direction based on the measured magnetic field components, and for determining said AC current based on the magnetic field gradient or magnetic field difference; wherein the electrical conductor comprises a first cut-out, a second cut-out, and a third cut-out, spaced apart from each other along the first direction, the first and the third cut-out extending in a transverse direction from a first side of the electrical conductor, the second cut-out extending in a transverse direction from a second side of the electrical conductor opposite the first side; wherein the sensor device is positioned relative to the electrical conductor such that a reference point of the sensor device situated in the middle between the two sensor elements is located at a first distance from a middle of the second cut-out measured in the first direction, and is located at a second distance from the electrical conductor measured in the third direction; wherein the second predefined distance is a value in the range from 0.0 mm to 5.0 mm; and wherein the first predefined distance is chosen corresponding to a location where a magnitude of said magnetic field difference or said magnetic field gradient is substantially constant within a predefined tolerance margin of +/−5.0% in a predefined frequency range comprising at least the range from 100 Hz to 2 kHz.

The term "predefined overall width" means the width of the electrical conductor if it would not have any cut-outs. The electrical conductor without cut-outs is preferably substantially beam-shaped.

The electrical conductor may be part of a busbar.

The present invention is mainly based on the discovery that a location exists where the magnetic field difference (ΔBx) of a magnetic field generated by an AC current, when flowing through said electrical conductor having three cutouts, is highly independent of the frequency of the AC current, for frequencies up to about 2 KHz, despite of the skin effect.

As far as the inventors are aware, this characteristic of the magnetic field is not known in the art. As can be appreciated, the claim is not directed to the characteristic of the magnetic field per se, nor to the discovery of the existence thereof, but to a current sensor arrangement exploiting the benefit of this characteristic, by specifying that the reference point of the sensor device needs to be located at a particular location relative to the electrical conductor where the magnetic field has this characteristic, also referred to herein as "the sweet zone".

The inventors surprisingly found that said magnetic field difference (ΔBx) or magnetic field gradient (dBz/dx) measured by this sensor device is substantially proportional to the AC current, not only for low frequency currents (e.g. having a frequency up to about 100 Hz), but also for AC currents having frequencies in a predefined frequency range including the range from 100 Hz to 2000 Hz, despite the skin effect.

The preferred location of the sensor device may also be formulated as the location where the first predefined distance "ds" is chosen such that a ratio of the magnitude of the AC current and the magnitude of the magnetic field difference (ΔBx) is substantially constant within said predefined tolerance margin for AC currents having one or more frequencies in said predefined frequency range.

Or stated in other words, it was surprisingly found that the difference or gradient signal measured "in the sweet zone" is proportional to the amplitude of the AC current, with a predefined constant which is independent of the frequency in the predefined frequency range.

It is pointed out that this location of the sensor device, or more in particular, of the reference point "R" of the sensor device, is completely different from a location "above the center of the electrical conductors (see e.g. FIG. 3).

In contrast, a difference or gradient signal measured above the centers of the conductor portions as depicted in FIG. 3), is attenuated by approximately 10% for an AC current having a frequency of 2 kHz, with respect to an AC current having a frequency of about 100 Hz with the same amplitude.

An important insight provided by the present invention is that an AC current can be measured with improved accuracy, by deliberately mounting the gradiometric sensor device at a predefined location relative to the electrical conductor, and by measuring said magnetic field difference ΔBx or gradient dBx/dx of the magnetic field at said location. It is an advantage that this current sensor has an excellent AC-response (=technical effect), not only for sinusoidal signals having a frequency in the range from 100 to 2000 Hz, but also for signals having multiple frequencies in the range from 100 Hz to 2000 Hz, for example a block-wave or a saw-tooth signal, or the like.

It is a major advantage of this current sensor arrangement that the amplitude (or magnitude) of the magnetic field difference (ΔBx) or the magnetic field gradient (dBz/dx) is substantially proportional to the amplitude (or magnitude) of the AC current using a constant factor, for an AC current having any frequency in the predefined frequency range. With "constant factor" is meant that the factor is independent of the frequency.

In an embodiment, the predefined tolerance margin is +/−4.5%.

In an embodiment, the predefined tolerance margin is +/−4.0%.

In an embodiment, the predefined tolerance margin is +/−3.5%.

In an embodiment, the predefined tolerance margin is +/−3.0%.

In an embodiment, the predefined tolerance margin is +/−2.5%.

In an embodiment, the predefined tolerance margin is +/−2.0%.

In an embodiment, the predefined tolerance margin is +/−1.5%.

In an embodiment, the predefined tolerance margin is +/−1.0%.

In an embodiment, the predefined frequency range is the range from 100 Hz to 2000 Hz.

In an embodiment, the predefined frequency range is the range from 1 Hz to 2000 Hz.

In an embodiment, the predefined frequency range is the range from 100 Hz to 2500 Hz.

In an embodiment, the predefined frequency range is the range from 1 Hz to 2500 Hz.

In an embodiment, the sensor device is positioned relative to the electrical conductor such that a ratio of a complex representation of the magnetic field difference or the magnetic field gradient and a complex representation of the AC current is a complex value having a substantially constant amplitude within a first predefined tolerance margin of +/−5.0%, and having a substantially constant phase within a second predefined tolerance margin of +/−5.0°, for AC currents having a frequency in the predefined frequency range.

The amplitude of the complex ratio is also referred to as the "gain" or "attenuation", and the phase of the complex ratio is also referred to as the "phase shift". In other words, in this embodiment, both the attenuation (A) and the phase shift (φ) of said magnetic field gradient (dBz/dx) relative to the sinusoidal AC current that generated it, are substantially independent of a frequency of the AC current.

In an embodiment, the first predefined tolerance margin is +/−5.0% and the second predefined tolerance margin is +/−5.0°.

In an embodiment, the first predefined tolerance margin is +/−4.5% and the second predefined tolerance margin is +/−4.5°.

In an embodiment, the first predefined tolerance margin is +/−4.0% and the second predefined tolerance margin is +/−4.0°.

In an embodiment, the first predefined tolerance margin is +/−3.5% and the second predefined tolerance margin is +/−3.5°.

In an embodiment, the first predefined tolerance margin is +/−3.0% and the second predefined tolerance margin is +/−3.0°.

In an embodiment, the first predefined tolerance margin is +/−2.5% and the second predefined tolerance margin is +/−2.5°.

In an embodiment, the first predefined tolerance margin is +/−2.0% and the second predefined tolerance margin is +/−2.0°.

In an embodiment, the first predefined tolerance margin is +/−1.5% and the second predefined tolerance margin is +/−1.5°.

In an embodiment, the predefined tolerance margin is +/−1.0% and the second predefined tolerance margin is +/−1.0°.

In an embodiment, the sensor device is positioned relative to the electrical conductor such that a real part of the first magnetic component is substantially equal to a real part of the second magnetic field component within a predefined tolerance margin of +/−5.0%, and such that an imaginary part of the first magnetic field component is substantially equal to an imaginary part of the second magnetic field component within said predefined tolerance margin, for AC currents having a frequency in the predefined frequency range.

In an embodiment, the predefined tolerance margin is +/−4.5%.

In an embodiment, the predefined tolerance margin is +/−4.0%.

In an embodiment, the predefined tolerance margin is +/−3.5%.

In an embodiment, the predefined tolerance margin is +/−3.0%.

In an embodiment, the predefined tolerance margin is +/−2.5%.

In an embodiment, the predefined tolerance margin is +/−2.0%.

In an embodiment, the predefined tolerance margin is +/−1.5%.

In an embodiment, the predefined tolerance margin is +/−1.0%.

In an embodiment, a projection of the reference point of the sensor device in the third direction intersects a space defined by the second cut-out.

Or stated in simple terms, in this embodiment, the reference point R of the sensor device is located "above" or "below" the second cut-out region and does not intersect the electrical conductor.

In an embodiment, a projection of each of the two sensor elements in the third direction intersects a space defined by the second cut-out.

Or stated in simple terms, in this embodiment, the two sensor elements are both located "above" or "below" the second cut-out region. An example of this embodiment is illustrated in FIG. 5(d).

In an embodiment, a projection of one of the two sensor elements in the third direction intersects a space defined by the second cut-out; and wherein a projection of the other of the two sensor elements in the third direction intersects the electrical conductor.

Or stated in simple terms, in this embodiment, one sensor element is located "above" or "below" the second cut-out region, and the other sensor element is located above the electrical conductor. An example of this embodiment is illustrated in FIG. 5(e), FIG. 6(e) and FIG. 7(e).

In an embodiment, a projection of both of the two sensor elements in the third direction intersects the electrical conductor.

Or stated in simple terms, in this embodiment, both sensor elements are located "above" or "below" the electrical conductor. An example of this embodiment is illustrated in FIG. 7(d).

In an embodiment, the predefined distance "dx" between the two sensor elements is smaller than the width "W" of the second cutout, e.g. smaller than 90% of W, or smaller than 80% of W, or smaller than 70% of W, or smaller than 60% of W, or smaller than 50% of W, or smaller than 40% of W.

In an embodiment, the sensor elements are located at a first, respectively second sensor position along the X-axis, which are situated between the positions x1, x2 where the magnetic field components Bx1, Bx2 reaches a local maximum (as illustrated in FIG. 2).

In an embodiment, the predefined distance (dx) between the two sensor elements is a value in the range from 0.5 mm to 3.0 mm, or from 1.0 mm to 2.5 mm, or from 1.5 mm to 2.2 mm.

In an embodiment, an overall width (Wo) of the electrical conductor is a value in the range from 5 to 25 mm, or in the range from 5 to 20 mm, or in the range from 5 to 15 mm, or in the range from 5 to 10 mm, or in the range from 6 to 8 mm.

In an embodiment, the thickness (T) of the electrical conductor is a value in the range from 1 mm to 4 mm, or in the range from 2 to 5 mm, or in the range from 3 to 5 mm.

In an embodiment, the first, second and third cut-out each has a cut-out width (W) in the range from 1 mm to 5 mm, or in the range from 2 to 5 mm, or in the range from 3 to 5 mm.

In an embodiment, a first spacing between the first cut-out and the second cut-out is a value in the range from 3 to 10 mm.

In an embodiment, a second spacing between the second cut-out and the third cut-out is a value in the range from 3 to 10 mm.

In an embodiment, the first, second and third cut-out each have a cut-out length (L) in the range from 51% to 95% of the overall width (Wo) of the electrical conductor, or from 55% to 90%, or from 60% to 80%.

In an embodiment, the first and third cut-out have a first length, and the second cutout has a second length optionally different from the first length, and a sum of the first and second length is larger than 90% of the overall width (Wo) of the electrical conductor, or larger than 95% of Wo, or larger than 100% of Wo, or larger than 102% of Wo, or larger than 105% of Wo.

In an embodiment, each cut-out has a length from 40% to 90% of the overall width Wo of the electrical conductor, or from 45% to 90%, or from 51% to 80%, or 55% to 80%, or 60% to 80%.

In an embodiment, a first length L1 of the first cutout and a third length L3 of the third cutout are equal, but different from a second length L2 of the second cutout.

In a further or another embodiment, a first width W1 of the first cutout and a third width W3 of the third cutout are equal, but different from a second width W2 of the second cutout.

In a further or another embodiment, the first spacing SP1 between the first and second cutout, and the second spacing SP2 between the second and third cutout are equal.

In an embodiment, the two sensor elements are spaced apart by a distance (dx) in the range from 0.5 mm to 3.0 mm, or in the range from 1.0 mm to 3.0 mm, or in the range from 1.5 to 2.5 mm.

In an embodiment, the thickness of the electrical conductor is a value in the range from about 1 mm to about 4 mm; and a first spacing between the first and the second cut-out and a second spacing between the second and the third cut-out is about 3 mm; and a width of the first, second and third cut-out is a value in the range from about 1 to about 2 mm; and the second predefined distance (Zs) is a value in the range from 0.0 mm to the value of said width; and the first predefined distance (ds) is a value in the range from 0.0 mm to a predefined constant ds2, which can be determined based on the geometry of the electrical conductor.

Or stated in simple terms, in this embodiment with particular value of T, SP, W, the reference point R of the sensor device needs to be located in a rectangular area defined by: Zs in the range from [0.0 to W] and ds in the range from [0 to ds2]. These embodiments are illustrated by the "first group" 1001 of FIG. 10.

In an embodiment, the value of ds2 is determined in accordance with the following formula: ds2=0.7+0.3*(W−1). Using this formula, the value of ds2 is 0.7 mm when W=1 mm, and the value of ds2 is 1.0 mm when W=2 mm.

Alternatively, instead of stating that the reference point R of the sensor device needs to be located in the rectangular area specified above, one could also say that the reference point R needs to be located in a first quadrant (i.e. ds>=0 and Zs>=0) of a predefined area defined by the formula: (zs/Z0)^3+(ds/X0)^3=1, wherein X0 and Z0 are predefined constants which can be determined based on the geometry of the electrical conductor.

In an embodiment, the thickness of the electrical conductor is a value in the range from about 1 mm to about 4 mm; and wherein a spacing between the first and second cut-out and between the second and third cutout is about 3 mm and the width of the cut-outs is a value in the range from about 3 to about 5 mm, or wherein a spacing between the first and second cut-out and between the second and third cutout is about 4 mm and the width of the cut-outs is a value in the range from about 4 to about 5 mm; and wherein the first and the second predefined distance are positive values located in a predefined area defined by the formula: (Zs/Z0)^2+(ds/X0)^2=1, where X0 and Z0 are predefined constants, which can be determined based on the geometry of the electrical conductor.

These embodiments are illustrated by the "second group" 1002 of FIG. 10.

In an embodiment, the value Z0 can be determined in accordance with the following formula: Z0=2.8+0.4*(W−3), and the value X0 can be determined in accordance with the following formula: X0=1.5+0.5*(W−3), wherein W is the predefined cut-out width expressed in mm.

The value of Z0 may be at least 0.5 mm if the spacing SP is equal to about 3 mm.

The value of Z0 may be at least 1.0 mm if the spacing SP is equal to about 4 mm.

In an embodiment, the thickness of the electrical conductor is a value in the range from about 1 mm to about 4 mm; and a spacing between the cutouts is a value in the range from about 5 to about 10 mm and the width of the cut-outs is a value in the range from about 1 to about 5 mm, or wherein a spacing between the cutouts is equal to about 4 mm and the width of the cut-outs is a value in the range from about 1 to about 3 mm; and wherein the first and the second predefined distance are positive values located in an area between a first curve and a second curve; the first curve being defined by the formula: (zs/Zu)^2+(ds/Xu)^2=1; the second curve being defined by the formula: (zs/ZL)^1.5+(ds/XL)^1.5=1, wherein Zu, Xu, ZL, XL are predefined constants, which can be determined based on the geometry of the electrical conductor.

These embodiments are illustrated by the "third group" 1003 of FIG. 10.

In an embodiment, the value Zu can be determined in according with the following formula: Zu=−0.18+1.35*(W/2+SP/7), and the value Xu can be determined in according with the following formula: Xu=−0.09+0.92*(W/2+SP/12), and the value ZL can be determined in according with the following formula: ZL=0.75*(W/2+SP/3−1.27), and the value XL can be determined in according with the following formula: XL=0.28+0.93*(W/2+SP/12−0.73), wherein SP is the spacing between the cut-outs, and W is the width of the cut-outs.

In an embodiment, the thickness of the electrical conductor is a value in the range from about 1 mm to about 4 mm; and a spacing between the first and second cut-out and between the second and third cutout is a value in the range from about 3 to about 10 mm and a width of the cut-outs is a value in the range from about 1 to about 5 mm; and wherein the first and the second predefined distance are positive values located on a predefined curve defined by the formula: (zs/Z0)^2+(ds/X0)^2=1, where X0 and Z0 are predefined constants, which can be determined based on the geometry of the electrical conductor, or at locations above or below this curve having the same value of the first distance equal (ds) but having a second distance (Zs) which may deviate from the value of the curve by at most +/−(ds/X0)*W/N, wherein W is the width of the cutouts, and N is an integer in the range from 2 to 10.

In other words, for a given set of parameters T, W, SP of the electrical conductor, a value Z0 and X0 can be calculated by the formulas above, the value Z0 representing the intersection of an ellipse with the Z-axis, the value X0 representing the intersection of said ellipse with the X-axis. But the values of the ellipse are not the only values (ds, Zs) for which the invention works very well, but an excellent AC measurement can also be performed if the sensor device is located slightly higher or slightly lower than this point on the ellipse. The amount of "slightly higher" or "slightly lower" is proportional to the width W of the cut-out, is largest above the center of the gap (ds=0), and decreases as the distance ds increases.

The deviation ΔZ of the value Zs above or below its ideal value (defined by the ellipse) depends on the desired accuracy. The larger the value of N, and thus the closer the values ds, Zs are to the ellipse, the better the accuracy of the AC measurement.

In an embodiment, the value Z0 can be determined based on the following formula: Z0=−1.67+0.47*(W/2+SP), and the value X0 can be determined based on the following formula: X0=−0.21+0.97*(W/2+SP/10), wherein SP is the spacing between the cut-outs, and W is the width of the cut-outs, both expressed in mm.

In an embodiment, the sensor device is an integrated circuit, and the electrical conductor is a busbar.

The sensor device may be mounted on a printed circuit board (PCB). If the printed circuit board is located between the sensor device and the electrical conductor, the reference point R of the sensor device is typically located at least 2.0 mm from the busbar. If the sensor device is located between the printed circuit board and the electrical conductor (e.g. mounted "upside down"), the reference point R of the sensor device may be located at a distance from about 0.0 mm to to about 4.0 mm from the busbar.

The sensor device may comprise a semiconductor substrate in a moulded package.

According to a second aspect, the present invention provides a current sensor system comprising at least two or at least three current sensor arrangements according to any of the previous claims, and optionally further comprising an electrical motor.

In an embodiment, the current sensor system comprises three busbars and comprises three sensor devices, each sensor device being arranged above or below one of said busbars.

It is an advantage of measuring the signals Bx1 and Bx2 at two positions having an equal distance to the other busbars, because when subtracting Bx1 and Bx2, any crosstalk from the other busbar is highly reduced.

The current sensor arrangements or systems described above are particularly useful for measuring one or more AC currents provided to an electrical motor in an industrial or an automotive environment, with high accuracy, for example a three-phase motor.

According to a third aspect, the present invention provides a method of measuring an AC electrical current having a frequency in a predefined frequency range comprising the range from 100 Hz to 2000 Hz, using a current sensor arrangement according to the first aspect, the method comprising the steps of: a) measuring, by the sensor device, a first and a second magnetic field component oriented in the first direction, at two different locations spaced apart along the first direction; b) determining a difference or a gradient of these magnetic field components; c) determining said AC current based on the magnetic field difference or gradient.

Step b) and c) may be formed by a digital processing circuit of the sensor device.

In fact, this method can measure at least one of the magnitude of an AC current, the phase of the AC current, or both the magnitude and the phase of the AC current.

In an embodiment, the method is a method of measuring the magnitude of the AC current with an absolute accuracy of +/−4%, or +/−3%, or +/−2%.

In an embodiment, step c) comprises: determining the AC current by multiplying an amplitude of the magnetic field gradient by a predefined factor. This factor may be a predefined constant value. This value can be determined by calibration, or by simulation, or in any other suitable way. This constant may be hardcoded or may be stored in a non-volatile memory of the sensor device.

In an embodiment the sensor device further comprises at least one temperature sensor and at least one mechanical stress sensor; and the sensor device is further configured for determining said AC current based on the magnetic field gradient and based on one or both of said temperature and said mechanical stress.

In an embodiment, the sensor device comprises a first and a second temperature sensor for measuring a temperature of the first and second magnetic sensor element, and comprises a first and a second mechanical stress sensor for measuring a mechanical stress exerted upon the first and second magnetic sensor element, and the sensor device is further configured for determining said AC current based on the magnetic field gradient, and based on said first and second temperature, and said first and second mechanical stress, for example in a manner as described in EP3109658(A1).

In an embodiment, the sensor device comprises a semiconductor substrate comprising the first and second magnetic sensor element, a first and second biasing means for biasing the first and second magnetic sensor element, a first and a second amplifier for amplifying the first and second sensor signal provided by the first and second sensor element, and an analog-to-digital convertor (ADC) for digitizing the first and second sensor signal, or a signal derived therefrom; and wherein the sensor device further comprises at least one of: (i) a temperature sensor, and (ii) a differential stress sensor for measuring a differential stress exerted upon the first and second magnetic sensor; and wherein the sensor device is further configured for adjusting at least one of a biasing signal, the second amplifier gain, and a digital value of the amplified second sensor signal, based on a predefined function (f) of the temperature value (T) and/or the differential stress value (ΔΣ), before determining a difference between: a first signal or a first value derived from the first sensor signal, and a second signal or a second value derived from the second sensor signal; for example in a manner as described in co-pending patent application number EP20165059.5 filed on 23 Mar. 2020 by the same applicant, incorporated herein by reference in its entirety.

In an embodiment, the method further comprises step d) of measuring a temperature of one or both sensor elements and/or measuring a mechanical stress exerted upon one or both sensor elements; and step c) comprises: determining said AC current based on the magnetic field difference or magnetic field gradient and based on one or both of said temperature and said mechanical stress.

This boils down to measuring a magnetic field difference or gradient, and then correcting this gradient for temperature and/or stress, for example in a manner as described in EP3109658(A1), incorporated herein by reference in its entirety.

In an embodiment, the sensor device further comprises a semiconductor substrate comprising the first and second magnetic sensor element, a first and second biasing means for biasing the first and second magnetic sensor element, a first and a second amplifier for amplifying the first and second sensor signal provided by the first and second magnetic sensor element, an analog-to-digital convertor for digitizing the first and second sensor signal or a signal derived therefrom; and at least one of: (i) a temperature sensor for measuring a temperature of the semiconductor substrate, and (ii) a differential stress sensor for measuring a differential stress exerted upon the first and second magnetic sensor; and a processing means having an input port connected to an output of the ADC; and wherein the method further comprises step d) of measuring a temperature of one or both sensor elements and/or measuring a mechanical stress exerted upon one or both sensor elements; and wherein the method further comprises the step of: adjusting a biasing signal and/or adjusting an amplifier gain and/or adjusting a digital value of the amplified second sensor signal, based on a predefined function of the measured temperature and/or the measured differential stress, before determining a difference between: a first signal or a first value derived from the first sensor signal, and a second signal or a second value derived from the second sensor signal.

These method steps are described in more detail in co-pending patent application number EP20165059.5 filed on 23 Mar. 2020 by the same applicant, incorporated herein by reference in its entirety. It is a major advantage of this method that it can determine the gradient, and thus the AC current, with higher accuracy, in particular by substantially reducing or even completely eliminating a common mode portion of the individual magnetic field signals.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1 shows an electrical conductor as can be used in embodiments of the present invention. The electrical conductor has at least three cut-outs and is configured for conducting the current to be measured. FIG. 1(a) shows a top view, and FIG. 1(b) shows a cross section of the electrical conductor in the plane A-A. FIG. 1(c) shows a typical path followed by the current (in top view).

FIG. 2, comprising FIGS. 2(a) and 2(b), FIG. 2(a) shows a graph illustrating a typical waveform of the magnitude |B(x)| of the magnetic field component Bx oriented in the X-direction, of the magnetic field created by the AC current when flowing through the electrical conductor, measured at various positions on said X-axis.

FIG. 2(b) shows the electrical conductor of FIG. 1(b), and a printed circuit board (PCB) on top of the electrical conductor, as may be used in embodiments of the present invention. The main purpose of the PCB is to show that sensor elements of a sensor device mounted on the PCB are typically situated at 2 mm distance from the electrical conductor. A straight X-axis is defined parallel to the electrical conductor, located at a predefined distance Zs therefrom, and directed in the overall direction of the current flow (from left to right).

FIGS. 5(a) to 5(e), FIG. 5(a) and FIG. 5(b) show an electrical conductor having three cut-outs, like the one shown in FIG. 1, in top view and side view respectively, and show a schematic representation of a sensor device having two sensor elements spaced apart over a distance dx smaller than the width W of the second cut-out (substantially located between the first and third cutout).

FIG. 5(c) is an enlarged view of a schematic block diagram of the sensor device.

FIG. 5(d) is an enlarged view of a current sensor arrangement where both sensor elements are located above the second cut-out region.

FIG. 5(e) is an enlarged view of a current sensor arrangement where one of the sensor elements is located above the cutout region, and the other sensor element is located above a conductor portion.

FIGS. 6(a) to 6(e), shows a variant of the current sensor arrangement of FIG. 5, where the two sensor elements are spaced apart over a distance dx equal to the width W of the second cut-out.

FIGS. 7(a) to 7(e), shows a variant of the current sensor arrangement of FIG. 5, where the two sensor elements are spaced apart over a distance dx larger than the width W of the second cut-out.

FIG. 8, comprising FIGS. 8(a) and 8(b), FIG. 8(a) shows a current sensor arrangement according to any of the FIGS. 5 to 7, where a reference point "R" of the sensor device, defined as a virtual point in the middle between the two sensor elements, is located at a first distance "ds" from the center of the second cut-out measured in the X-direction, and is located at the second distance "Zs" from the electrical conductor measured in the Z-direction.

FIG. 8(b) shows a graph with a dashed curve representing locations in the XZ-plane where the signal ΔBx being the difference between the two magnetic field components Bx1 and Bx2 for a sinusoidal signal of 2 kHz has exactly the same phase as the signal ΔBx measured at the same location but induced by a sinusoidal signal of 100 Hz; and shows two solid curves at locations in the X-Z plane where the signal ΔBx induced by a 2 kHz current is phase shifted by +2° or −2° with respect to the signal ΔBx induced by a 100 Hz current. The area between these two solid curves are locations in the X-Z plane where the signal ΔBx at 2 kHz is phase shifted less than 2° (in absolute value) with respect to the signal ΔBx at 100 Hz.

In each of these plots, the horizontal axis is the X-axis, and the vertical axis is the Z-axis.

Figure 9A:
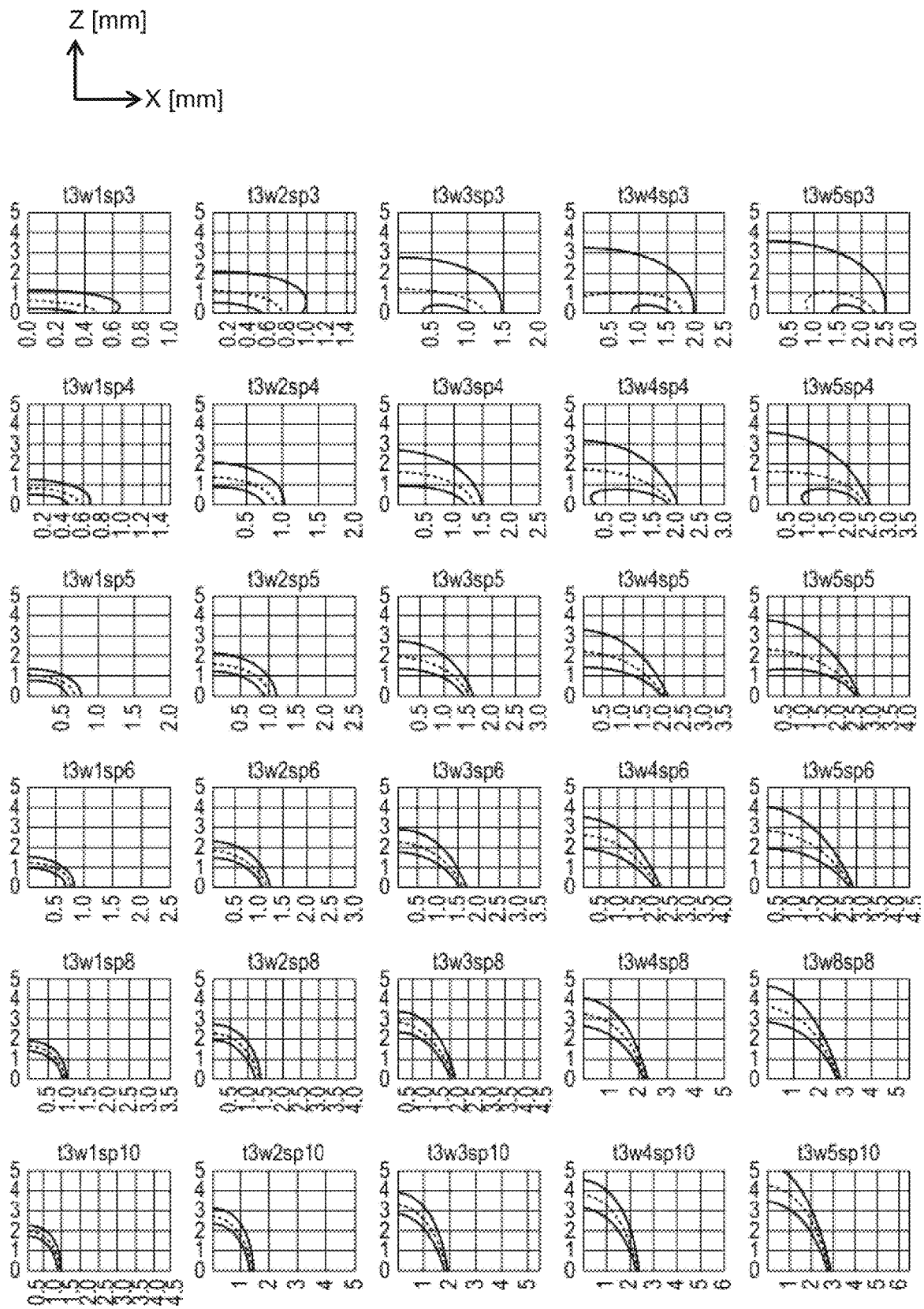
FIG. 9(a) shows a plurality of simulated plots, similar to that of FIG. 8(b), showing locations in the XZ plane, where the signal ΔBx induced by a 2 kHz current is 0° (dashed line) or +2° or −2° (solid lines) phase shifted relative to the signal ΔBx measured at the same location, but induced by a 100 Hz current.
Figure 9B:
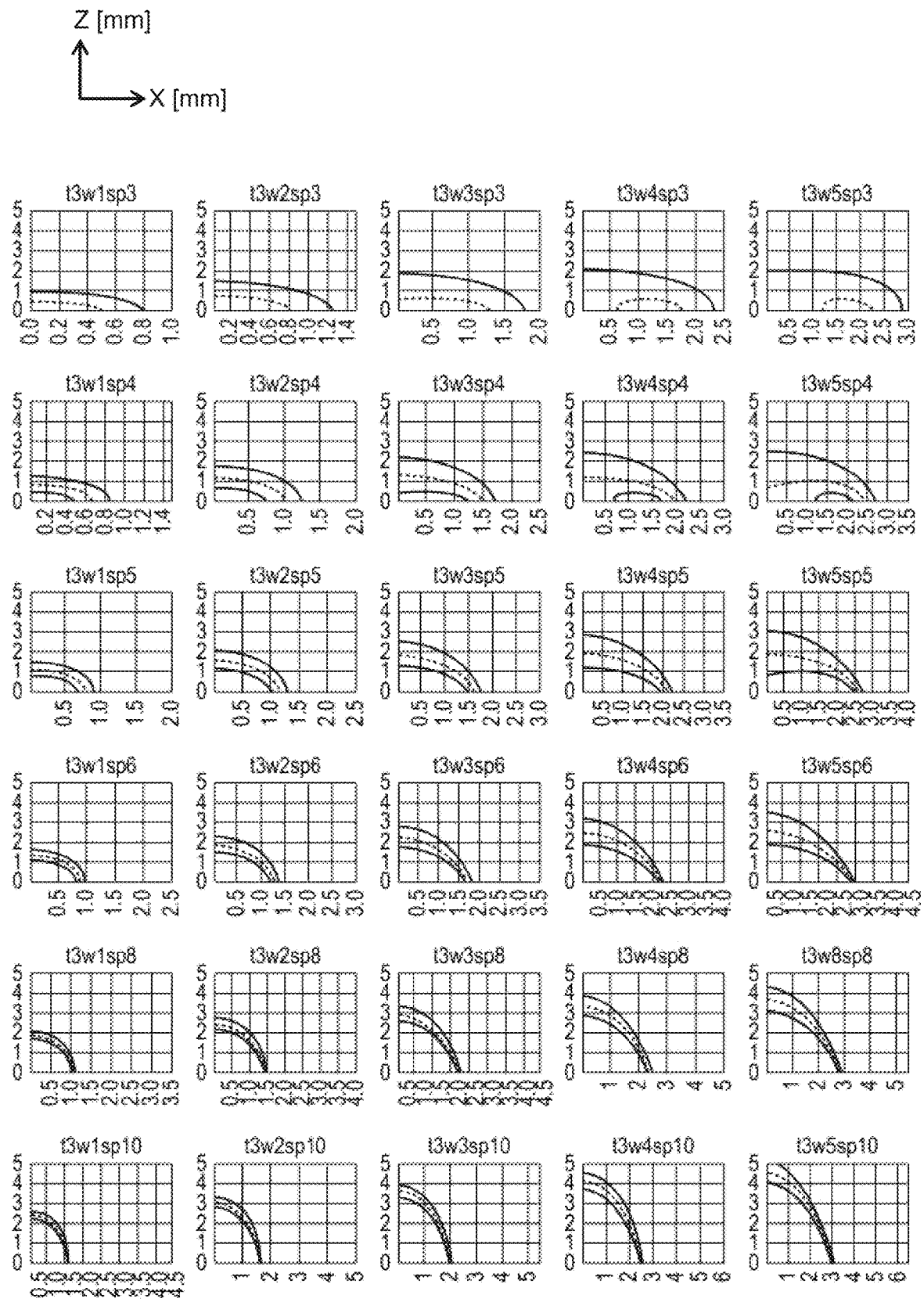

FIG. 9(b) shows a plurality of graphs, similar to that of FIG. 9(a), showing locations in the XZ plane, where the signal ΔBx induced by a 2 kHz current has a gain variation (i.e. amplification or attenuation) of 0%, +2% or −2% relative to the signal ΔBx measured at the same location, but induced by a 100 Hz current. Again, the horizontal axis is the X-axis, and the vertical axis is the Z-axis.

Figure 10:
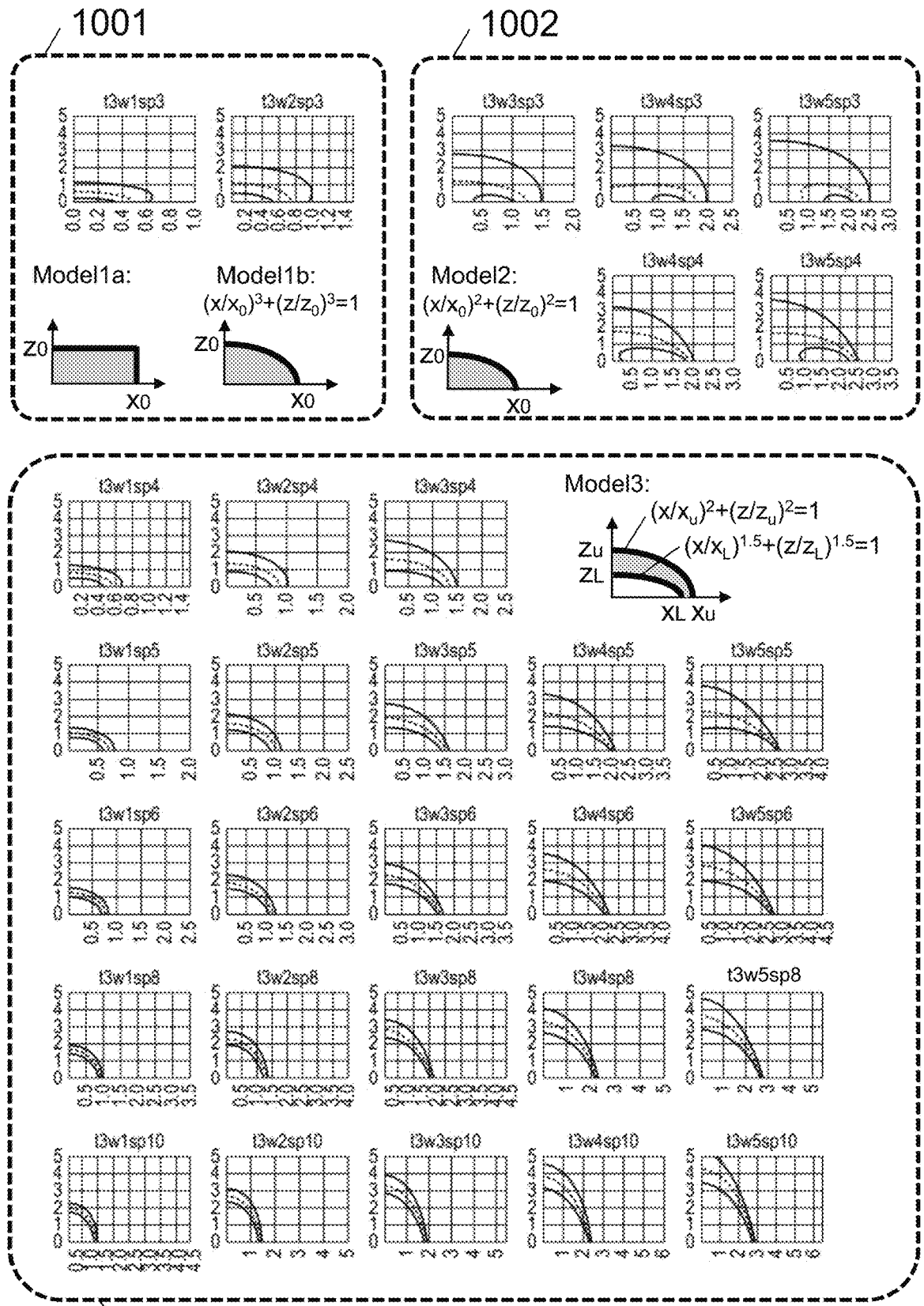

FIG. 10 shows how the areas of the graphs shown in FIG. 9(a) and FIG. 9(b) can be modelled.

A first group of graphs can be modelled by a rectangular area or by the area under a curve which can be described by an equation $(x/x0)^3 + (z/z0)^3 = 1$, where x0 is a constant value corresponding to the location where the curve intersects the X-axis, and z0 is a constant value corresponding to the location where the curve intersects the Z-axis.

A second group of graphs can be modelled by the area under a curve which can be described by an equation $(x/x0)^2 + (z/z0)^2 = 1$, optionally reduced to a portion of said area above a horizontal line with equation $z = z1$, where z1 is a predefined value.

A third group of graphs can be modelled by the area between an upper curve which can be described by an equation $(x/xu)^2 + (z/zu)^2 = 1$, where xu and zu are constants representing the intersections of the upper curve with the X and Z axis respectively, and a lower curve which can be described by an equation $(x/xL)^{1.5} + (z/zL)^{1.5} = 1$, where xL and zL are constants representing the intersections of the lower curve with the X and Z axis respectively.

Figure 11A:
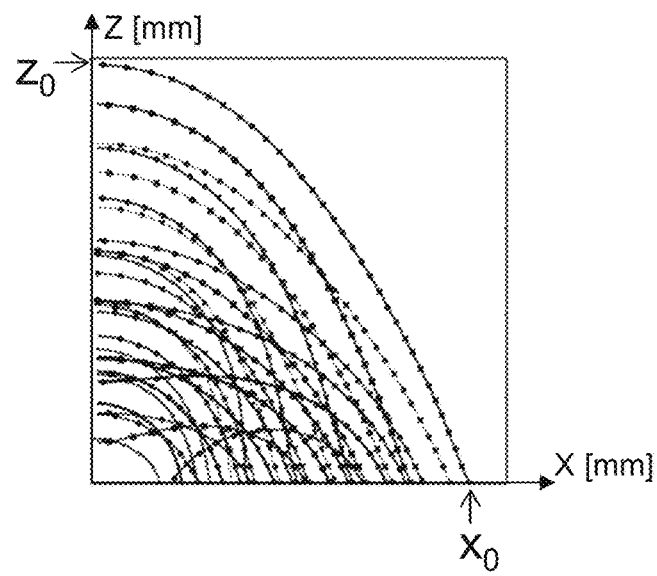

FIG. 11(a) shows all the "zero phase shift curves" of FIG. 9(a) and FIG. 9(b) together in a single graph.

Figure 11B:
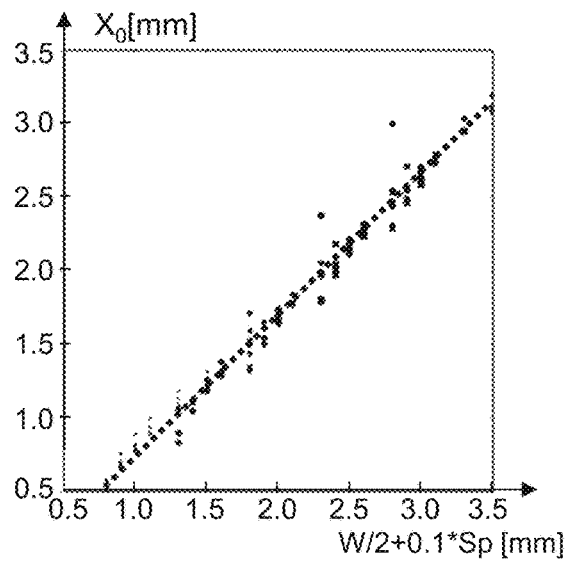
Figure 11C:
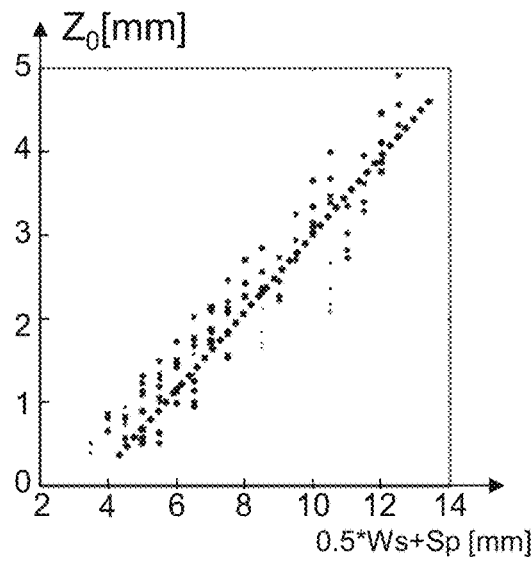

FIG. 11(b) and FIG. 11(c) show that the X0-values and Z0-values show a good correlation with a linear function of the width W and spacing SP of the central (second) cut-out of the electrical conductor.

Figure 12:
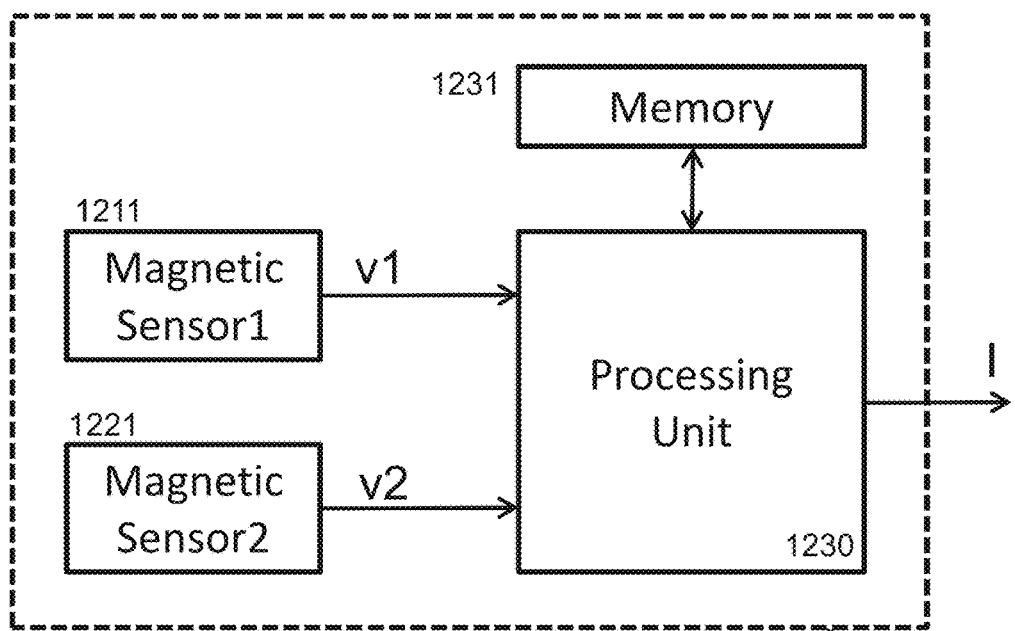

FIG. 12 shows an exemplary block-diagram of an electrical circuit which can be used in embodiments of the present invention.

Figure 13:
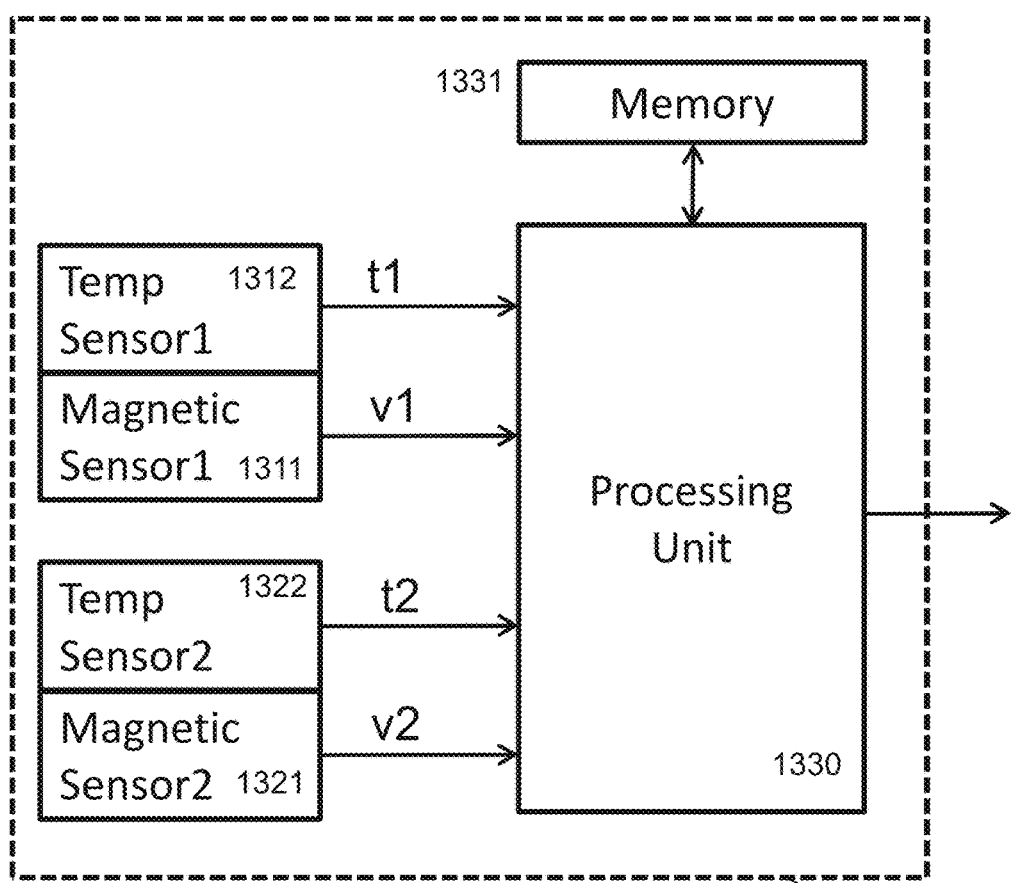

FIG. 13 shows an exemplary block-diagram of an electrical circuit which can be used in embodiments of the present invention.

Figure 14A:
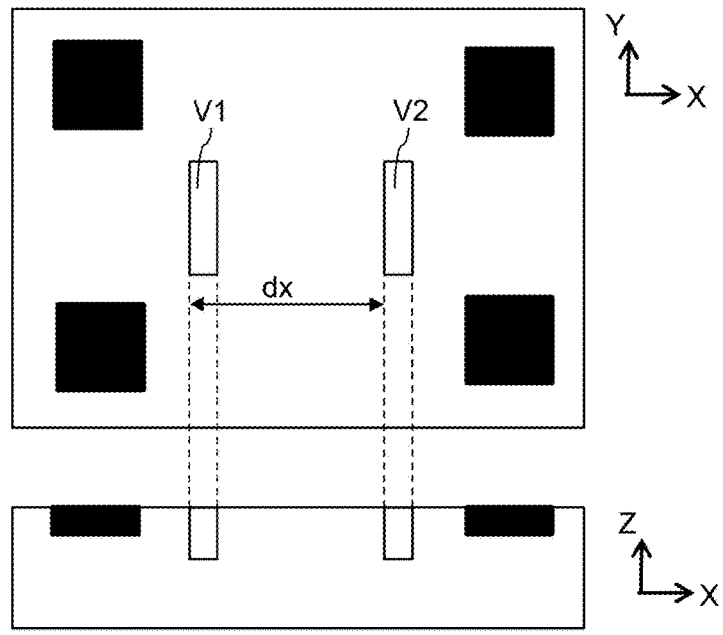

FIG. 14(a) is a schematic representation of an exemplary sensor device with two vertical Hall elements, as can be used in embodiments of the present invention.

Figure 14B:
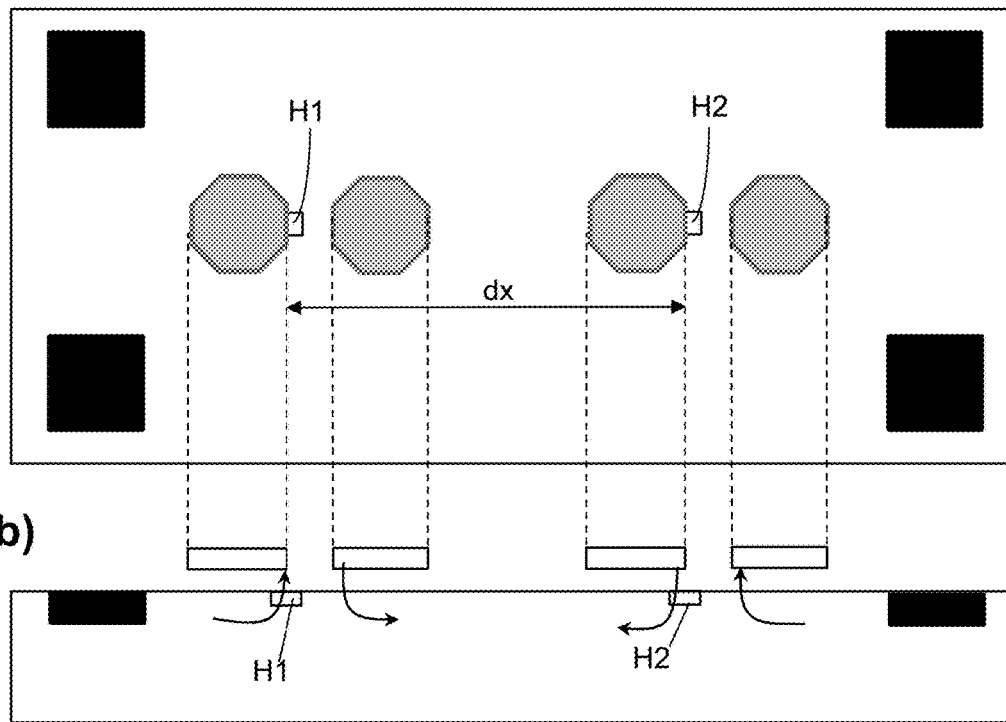

FIG. 14(b) is a schematic representation of an exemplary sensor device with two horizontal Hall elements and integrated magnetic concentrators (IMC), as can be used in embodiments of the present invention.

Figure 14C:
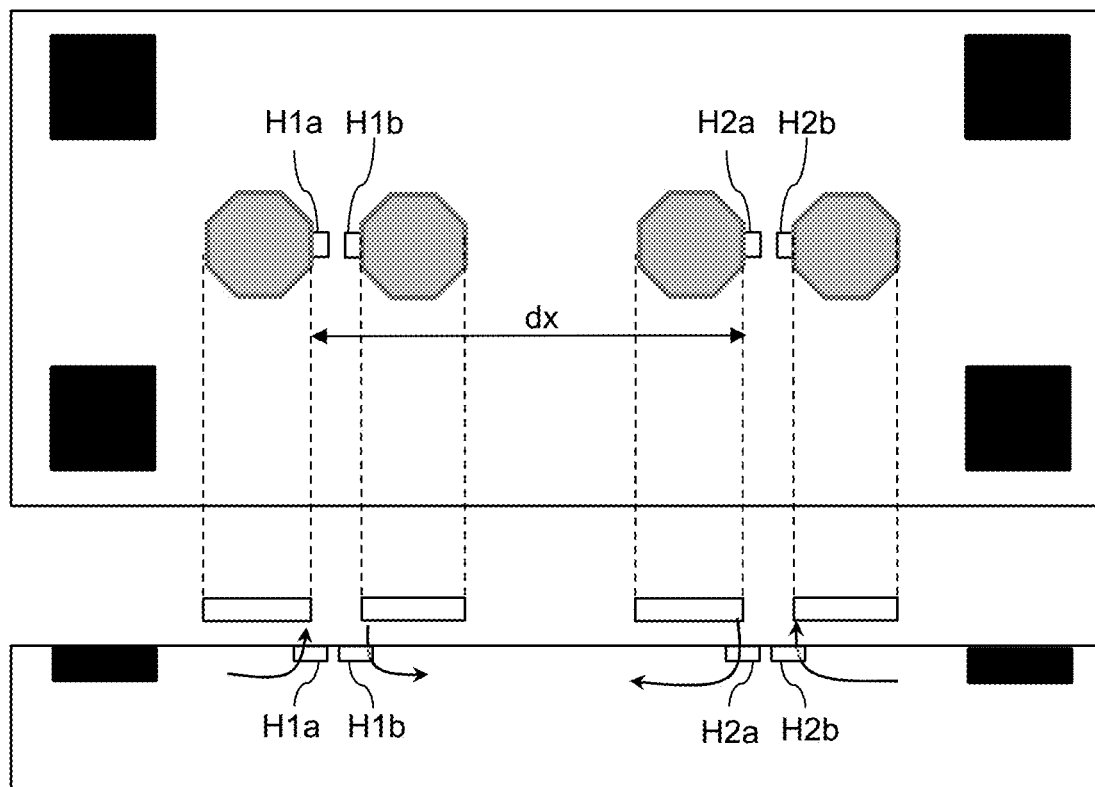

FIG. 14(c) is a schematic representation of an exemplary sensor device with four horizontal Hall elements and integrated magnetic concentrators (IMC), as can be used in embodiments of the present invention.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the expression "current sensor system" or "current sensor arrangement" mean the same. They refer to a system or arrangement comprising an electrical conductor and a current sensor device. The current sensor device may be a packaged semiconductor device (also known as "chip").

The electrical conductor may for example be a busbar having three cutouts (also known as "slits"). The region defined by the cutouts may comprise air, or an electrically non-conductive material.

It is known that complex numbers can be represented by a magnitude (or amplitude) and a phase, or by a real part and an imaginary part. For example, the complex number "1+i" can also be represented by a vector having an amplitude (or magnitude) of $\sqrt{2}$ and a phase of 45°.

In this document, the terms "magnetic field gradient" (e.g. dBx/dx) and "magnetic field difference" (e.g. ΔBx) are used interchangeably. Strictly speaking a magnetic field gradient is calculated as a magnetic field difference (e.g. Bx1−Bx2) divided by the distance between the sensor locations (e.g. dx), but in practice this distance is fixed, and the difference signal typically needs to be scaled anyway. Hence, in practice, the division by the distance dx can be omitted, or is incorporated in the scaling factor. A sensor device configured for determining a magnetic field gradient or a magnetic field difference is referred to as "gradiometric sensor device".

In this document, the expression "AC current of 100 Hz" refers to a sinusoidal current having a frequency of 100 Hz", and the expression "AC current of 2000 Hz" refers to a sinusoidal current having a frequency of 2000 Hz".

As used herein, the expression "an AC current" without specifying a frequency, refers to a current having a waveform which may or may not be purely sinusoidal, and may have a frequency spectrum (or discrete frequency components if the signal is periodic) having frequencies from about 100 Hz to about 2000 Hz.

In preferred applications, at least 95%, or at least 97% of the total energy of the signal to be measured has frequencies in the frequency spectrum from DC to 2000 Hz. Or stated in other words, in preferred embodiments, the amount of energy of the current signal to be measured corresponding to frequencies higher than 2000 Hz is less than 5%, or less than 3% of the total energy of the signal.

In this document, the expression "ΔBx at 2 kHz" is used as a shorthand for "the signal ΔBx induced by a sinusoidal current having a frequency of 2 kHz".

In this document, the notation x^2 means (x*x) or square (x), or power(x, 2).

In this document, the notation x^3 means (x*x*x) or power(x, 3).

In this document, the notation x^1.5 means x*sqrt(x) or power(x, 1.5).

In this document, the notation sqr( ) means "square", and sqrt( ) means "square root".

In this document, the expression "second cutout" or "central cutout" mean the same.

In this document, the statement that "the gain variation is smaller than +/−2%" means the same as the statement that "the absolute value of the gain variation is smaller than 2%". Likewise, the statement that the phase shift is smaller than +/−3° " means the same as the statement that the "absolute value of the phase shift is smaller than 3°".

When reference is made to "the spacing SP" without specifying the first or second spacing, reference is meant to both the first spacing between the first and second cutout, and to the second spacing between the the second and third cutout, the values of which are assumed to be equal.

When reference is made to "the length" of the cutouts without referring to a specific cutout, reference is made to the lengths of each of the cutouts, the values of which are assumed to be equal, unless it is clear from the context that something else was meant.

When reference is made to "the width" of the cutouts without referring to a specific cutout, reference is made to the width of each of the cutouts, the values of which are assumed to be equal, unless it is clear from the context that something else was meant.

The present invention relates to current sensors based on magnetic sensors, also referred to as "magnetic current sensors", as may be used in industrial or automotive applications, e.g. for measuring one or more currents provided to an electrical motor, e.g. in electrical or hybrid vehicles. Such electrical motors may be driven using relatively large AC currents, for example substantially sinusoidal currents having amplitudes of tens or even hundreds of amperes. The present invention is particularly concerned with accurately measuring such AC currents.

As already mentioned in the background section, It is known that, when an AC current flows through an electrical conductor, a phenomenon known as "skin effect" will occur. This causes the effective electrical resistance of the electrical conductor to increase. The higher the frequency of the electrical current, the higher the effective resistance of the electrical conductor.

The inventors of the present invention had the task of providing a sensor system for measuring an AC current flowing through an electrical conductor having an electrical conductor with three cut-outs as shown in FIG. 1, with improved AC accuracy. The AC current may for example be a sinusoidal current having any fixed or variable frequency from e.g. 100 Hz to e.g. 2000 Hz.

Measuring a DC current by measuring one or more characteristics of a magnetic field created by the current flowing through the conductor, is known in the art, but as far as is known to the inventors, it is not known how to accurately measure an AC current having an unknown frequency spectrum up to 2 kHz with an absolute accuracy of at most +/−5%, or at most +/−4%, or at most +/−3%, or at most +/−2%, or at most +/−1%.

FIG. 1 shows an electrical conductor 101 for conducting a current I in the X-direction (from left to right of the drawing). The electrical conductor 101 may be substantially beam shaped, having an overall width Wo (e.g. in the range from 5 to 25 mm), an overall length Lo, and a thickness T (e.g. in the range from about 1 to about 4 mm). The electrical conductor 101 may be part of a busbar.

The electrical conductor 101 shown in FIG. 1(a) has three rectangular cut-outs C1, C2, C3, comprising a first cut-out C1 having a width W1 (measured in the X-direction) and a length L1 measured in a transverse direction Y, perpendicular to the X direction, a second cut-out C2 having a width W2 measured in the X-direction and a length L2 measured in the transverse direction Y, and a third cut-out C3 having a width W3 measured in the X-direction and a length L3 measured in the transverse direction Y. With "cutout" is meant a through-hole or a through-opening or a slit, not a blind hole or a groove. It is important that no current can flow in the zone defined by the cut-out.

The first C1 and the third C3 cutout extend from a first side S1 of the electrical conductor 101, the second cutout C2 extents from a second side S2 of the electrical conductor, opposite the first side S1. The second cutout C2 is located substantially between the first cutout C1 and the third cutout C3 along the X-axis.

In the example shown in FIG. 1, the cutouts are of equal size, meaning that each of the first, the second and the third length L1, L2, L3 are equal, and that each of the first, second and third width W1, W2, W3 are equal, but the present invention is not limited hereto, and also works if the cutouts have different sizes. It is preferred however that the size of the first and the third cutout C1, C3 are identical, and that they are spaced apart from the second cutout by an equal amount, i.e. preferably SP1=SP2.

FIG. 1(a) shows the electrical conductor 101 in top view. In this example, each of the lengths L1, L2, L3 is at least 51% of the overall width Wo of the electrical conductor 101, such that projections of the cutout regions overlap in the Y-direction over an overlapping distance "Lo". A sensor device (not shown in FIG. 1, but see e.g. FIG. 5 to FIG. 7) is preferably located at a distance Ys from the first side S1 of the electrical conductor 101 inside this overlapping range Lo.

In a variant (not shown), L1 and L3 could for example be equal to 65% of Wo, and L2 could be equal to 40% of Wo, so that the overlapping distance Lo would be 5% of Wo. In this case, the sensor device would preferably be located at a distance Ys from the first side S1 in the range of 60% of Wo to 65% of Wo, e.g. at Ys=62.5% of Wo. But of course, the present invention is not limited to these examples, and other values can also be used.

FIG. 1(b) shows a cross section of the electrical conductor in the plane A-A of FIG. 1(a).

FIG. 1(c) shows a typical path followed by the current I when flowing through the electrical conductor from left to right. As can be seen, the current density is not uniform along the X-direction.

FIG. 2(b) shows the cross-section of the electrical conductor of FIG. 1(b), and shows in addition a printed circuit board (PCB) arranged above or on top of the electrical conductor. It is noted that a PCB is not required for the present invention to work, but a convenient means for mounting a sensor device (not shown in FIG. 2) at a predefined distance from the electrical conductor, e.g. busbar.

FIG. 2(a) shows a graph illustrating a waveform of the magnetic field component Bx oriented along the X-axis, for various locations on the X-axis, measured at a distance Zs of 2 mm above the electrical conductor, of a magnetic field created by a DC current or a low frequency current (e.g. of about 100 Hz). As shown, the magnitude of the signal Bx is largest (in absolute value) at location x1 which is located approximately above the middle of the conductor portion that is located between the first and the second cutout C1, C2, and at location x2 which is located approximately above the middle of the conductor portion that is located between the second and the third cutout C2, C3.

Using conventional knowledge, it is thus most advantageous to measure the signal Bx at the location x1 or at the location x2, because this is where the signal is largest, thus yielding a good signal-to-noise ratio (SNR); or to measure a first signal Bx1 at x1 and a second signal Bx2 at x2, and to subtract the signals Bx1 and Bx2, yielding a signal with twice the amplitude. However, the prior art does not teach what to measure, or where to measure signals in order to obtain a good AC behaviour.

The inventors started measuring the magnetic field generated by an AC current at the location x1 and x2, and they observed that the amplitude of the signal Bx caused by the AC current was gradually attenuated to about 90% of its original value, as the frequency of the sinusoidal AC current was increased from about 100 Hz to about 2 kHz. If the frequency of the AC current to be measured would be fixed and would be known, it would be possible to apply a predefined, but frequency-dependent correction factor to compensate for the frequency dependent attenuation. For example, this correction factor would close to 100% for a 100 Hz signal, would be close to 104% for a 1000 Hz signal, and would be close to 111% for a 2000 Hz signal. Thus if the frequency of the AC current signal would be constant and would be known, the correction factor can be determined, and the measured signal can be corrected accordingly. But since the frequency of the AC current signal to be measured is typically not constant and not known, it seemed impossible to accurately measure the AC current without knowing the frequency content. While it is possible to determine the frequency content of a signal using spectral analysis, this is very power consuming and time-consuming, and would require measurement of multiple samples, and thus cause a readout-delay, which is not preferable for the envisioned applications.

Hoping to find a simpler solution not requiring spectral analysis, the inventors came to the idea of simulating the real part and the imaginary part of a complex representation of the magnetic field signal Bx, hoping to gain more insights.

Figure 3:
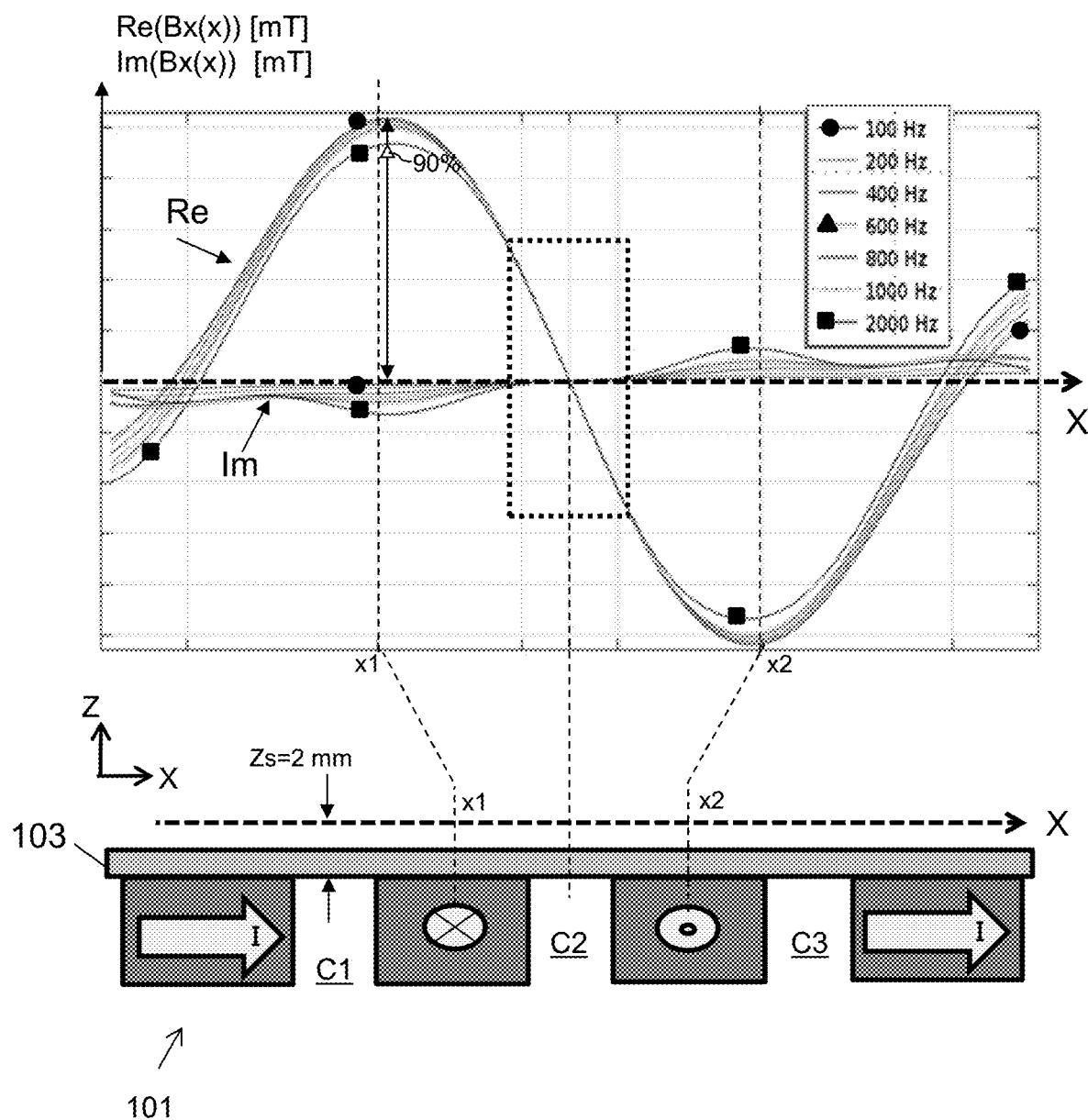
FIG. 3 shows the electrical conductor and the printed circuit board (PCB) of FIG. 2(b) and shows a plurality of waveforms representing the real part and the imaginary part of a complex representation of the magnetic field component signal Bx(x) along the X-axis, caused by a sinusoidal current having various frequencies ranging from 100 Hz to 2000 Hz.

FIG. 3 shows the electrical conductor and the printed circuit board (PCB) of FIG. 2(b), and shows a plurality of simulated waveforms representing the real part and the imaginary part of the signal Bx(x) as a function of the position along the X-axis, for sinusoidal currents having frequencies ranging from 100 Hz to 2000 Hz. As can be seen, the real part of Bx measured at x1 decreases (i.e. is attenuated) as the frequency increases. For example, if the Bx value at x1 induced by an AC-current of about 100 Hz is considered as a reference (i.e. 100%), it was found that this value is reduced to about 90% of its original value for an AC current of about 2 kHz. It is also shown that, especially around x1 and x2 the imaginary part increases.

But contrary to what they expected, they surprisingly found that the attenuation of the Bx(x) signal for a sinusoidal current of 2 kHz is not 10% for all locations between x1 and x2. As can be seen in FIG. 3(a), in the dotted rectangular area, the curves of the Bx signal caused by AC currents having various frequencies in the range from 100 Hz to 2 kHz seem to more or less merge. The inventors decided to investigate this in more detail.

Figure 4A:
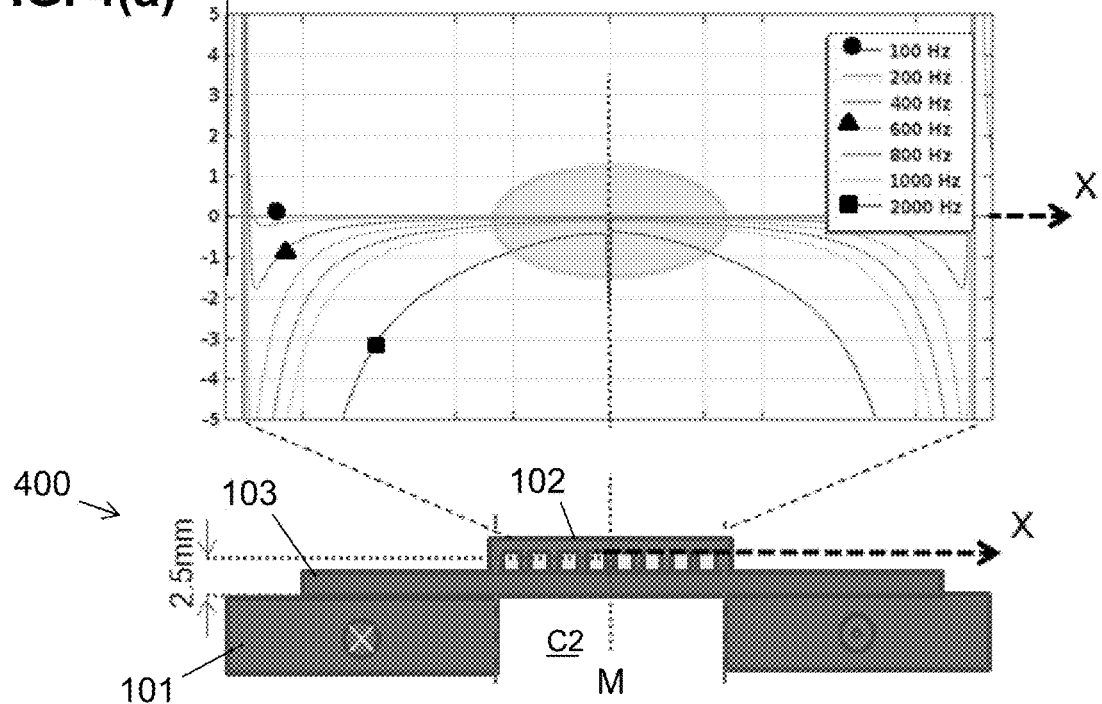
FIG. 4(a) shows the electrical conductor and the printed circuit board (PCB) of FIG. 3, and shows a sensor device mounted on the PCB, and shows a graph illustrating the gain variation of the signal Bx(x) caused by a sinusoidal current having a frequency "f", relative to Bx(x) caused by a sinusoidal current of 100 Hz signal (as a reference), measured at the same position X, expressed in percentage, for various frequencies ranging from 100 Hz to 2000 Hz, at an exemplary height of 2.5 mm.
Figure 4B:
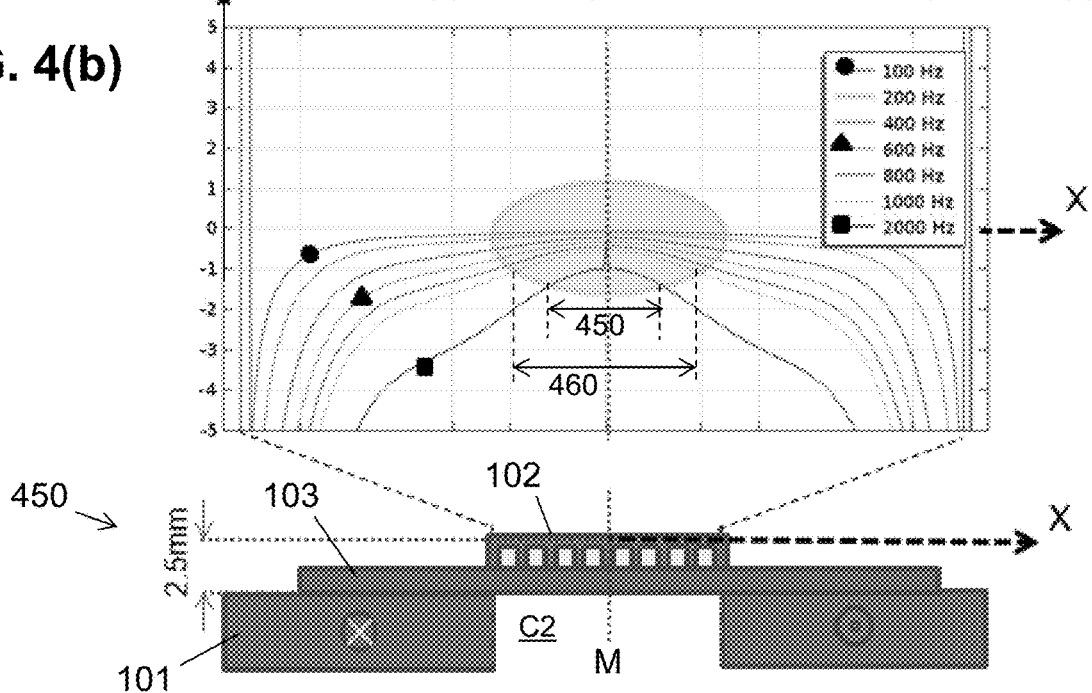
FIG. 4(b) shows the electrical assembly of FIG. 4(a) and shows the phase of the signal Bx(x) caused by a sinusoidal current of frequency "f" expressed in degrees, for various frequencies ranging from 100 Hz to 2000 Hz.

FIG. 4(a) shows an example of the attenuation (or gain variation) of the signal Bx(x) measured at a certain distance Zs above the second cutout region C2, for AC currents having various frequencies ranging from 100 Hz to 2000 Hz, normalized to the gain of the Bx(x) signal that would be created by a 100 Hz signal, measured at the same location, and FIG. 4(b) shows the angle or phase of the complex representation of the magnetic field Bx(x), as can be obtained by arctan(Im(Bx)/Re(Bx)).

As can be seen, near the middle M (in the X-direction) of the second cutout C2, the gain for a 100 Hz current is substantially equal to the gain for a DC current, but the gain of a 2 kHz signal is different.

As can be seen, the gain variation and the phase shift are not exactly equal to zero for AC currents having frequencies from about 100 Hz to about 2 kHz, but surprisingly are much smaller than the 10% which was the case at location x1 and x2 (see FIG. 3). The inventors realised that this discovery would allow them to measure the signal Bx with a reasonably large amplitude (see left and right side of the dotted rectangle of FIG. 3) and at the same time with a very good AC behaviour (i.e. small gain variation and small phase shift).

For reasons that will become clear further, it is noted that the simulations of FIG. 4(a) and FIG. 4(b) were performed for an electrical conductor having specific dimensions, and for sensor locations at a distance Zs=2.5 mm above the electrical conductor.

The inventors wondered what would happen if simulations would be performed for the same busbar but at different heights Zs, and what would happen if a difference signal or gradient signal ΔBx would be measured instead of a simple magnetic field component, and what would happen if the size and geometry of the busbar would be changed. Needless to say, they did not know what to expect, let alone to predict what the results would be. In order to find out, they performed a large number of simulations, which will be described in more detail further.

Before describing the simulation results in more detail, a few potential solutions will be described at high-level, referring to FIG. 5 to FIG. 7, each showing a current sensor assembly (or current sensor system) comprising an electrical conductor having three cut-outs C1 to C3 as described above, and having a current sensor device arranged in the vicinity of the second (central) cutout C2.

Figure 5:
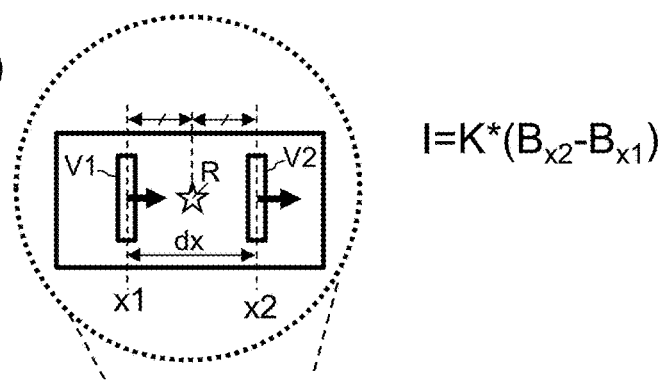
FIG. 5, comprising
Figure 5:
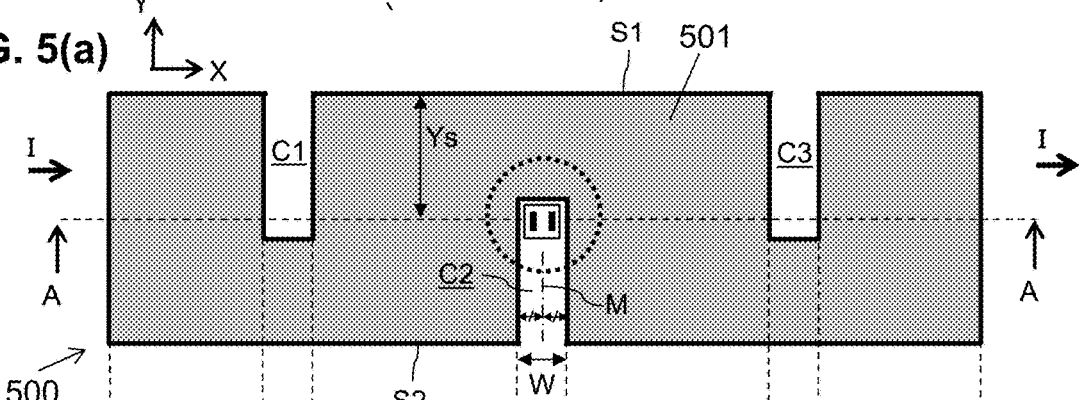
Figure 5:
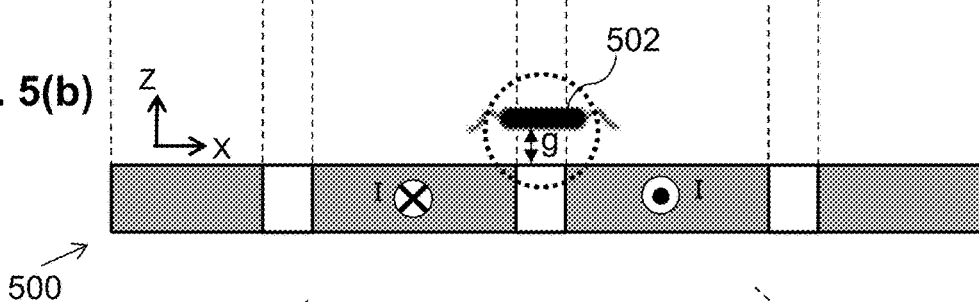
Figure 5:
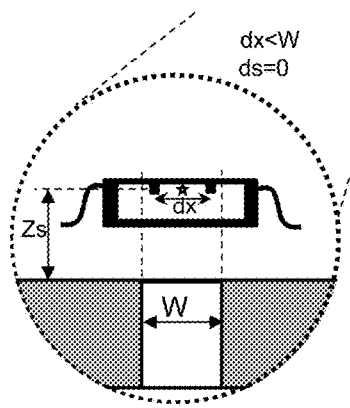
Figure 5:
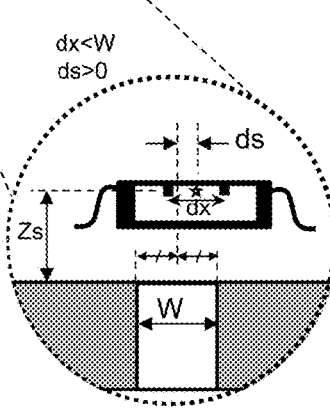
Figure 6:
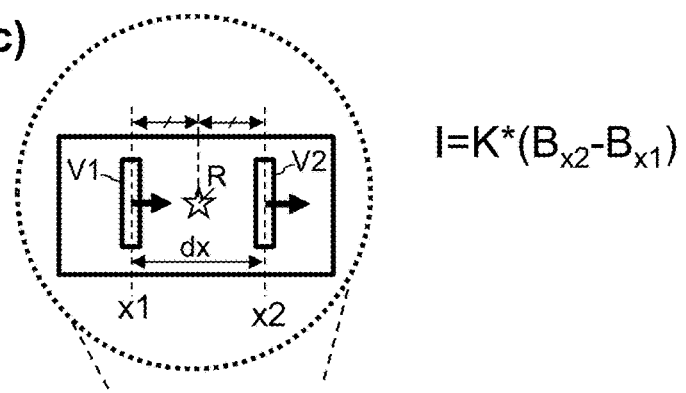
FIG. 6, comprising
Figure 6:
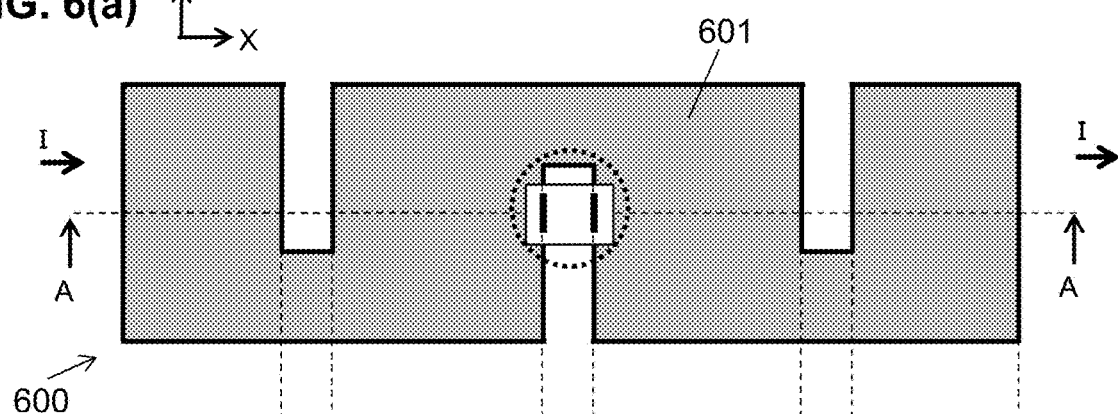
Figure 6:
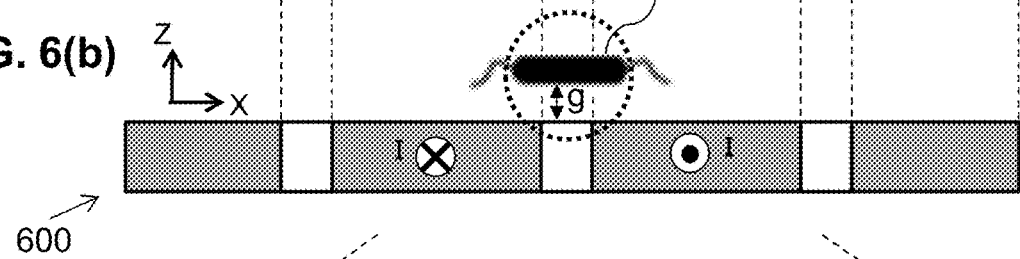
Figure 6:
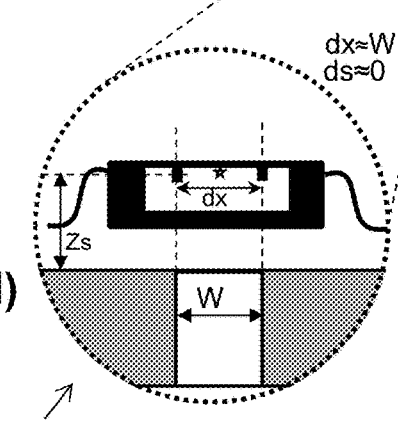
Figure 6:
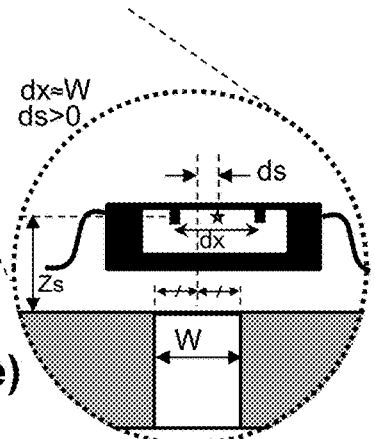
Figure 7:
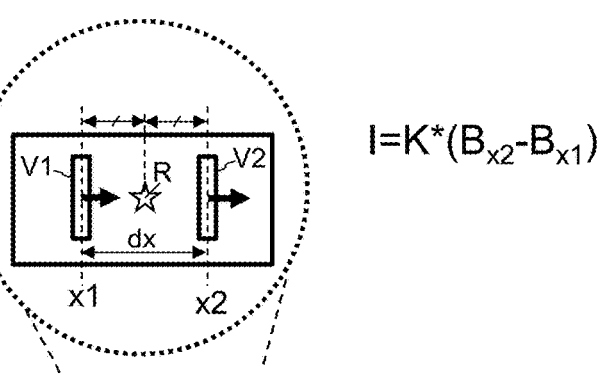
FIG. 7, comprising
Figure 7:
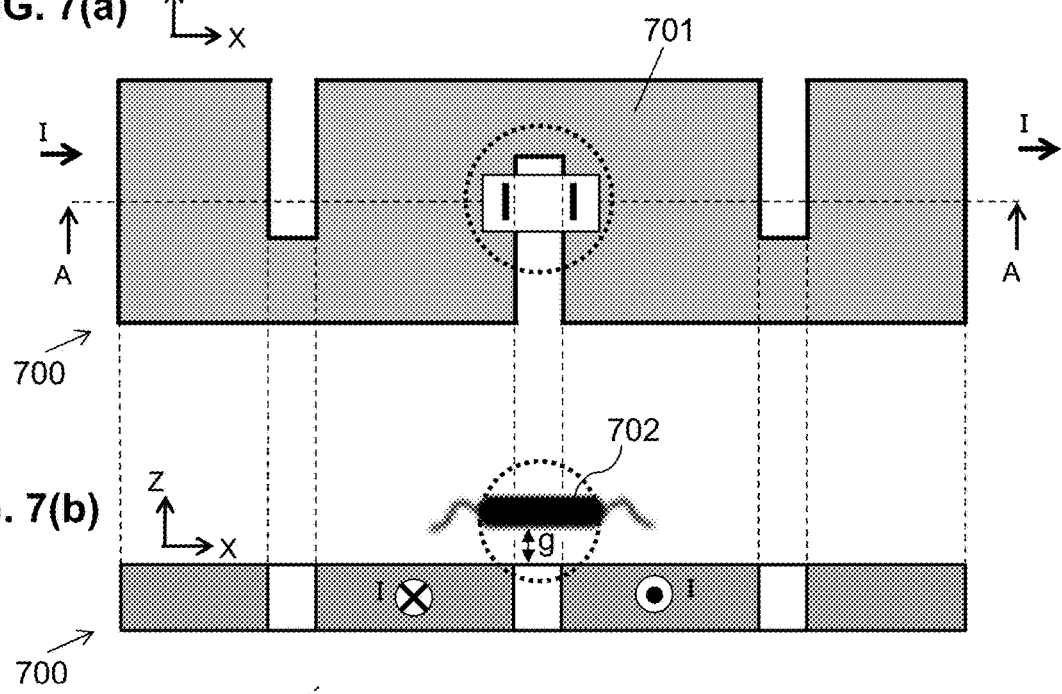
Figure 7:
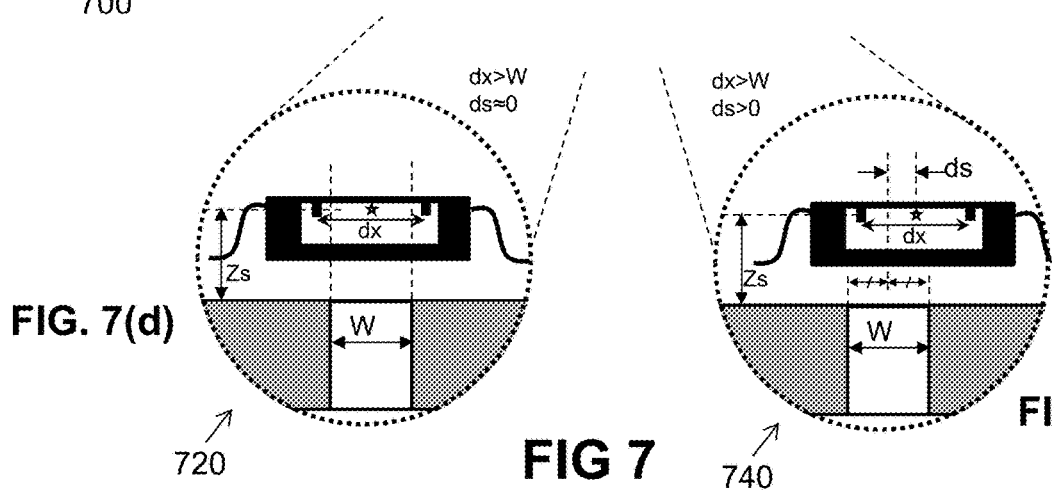

In the embodiments shown in FIG. 5 to FIG. 7, the sensor device 502, 602, 702 comprises two magnetic sensor elements (e.g. two vertical Hall elements V1, V2, for ease of explanation) spaced apart by a predefined distance dx along the X-direction. Sensor element V1 is configured for measuring a magnetic field component Bx1 oriented in the X-direction at a first sensor location, and sensor element V2 is configured for measuring a magnetic field component Bx2 oriented in the X-direction at a second sensor location, spaced apart from the first sensor location by a distance "dx". The sensor device is further configured for determining a magnetic field difference ΔBx or a magnetic field gradient dBx/dx along the X-direction based on these magnetic field components Bx1, Bx2, and for determining the AC current to be measured based on, e.g. solely based on the magnetic field gradient dBx/dx or the magnetic field difference ΔBx. If properly designed, the system is capable of measuring the AC current with an absolute accuracy within a predefined tolerance margin, for example within +/−4% or +/−3% or +/−2% or +/−1%, for AC currents having frequencies in the range from about 100 Hz to 2 kHz.

Rather than specifying the individual locations of each of the two sensor elements, the position of the gradiometric sensor device relative to the second cutout C2 will be described by specifying the position of an imaginary reference point "R" defined in the middle between the two sensor elements, indicated by a star in the drawings of this application, see e.g. FIG. 5(c). More in particular, the position of this reference point "R" (the star) relative to the second cutout C2 can be uniquely defined by means of:
  i) a first distance value "ds" being the distance measured in the X-direction between the star and a virtual plane parallel to the Y and Z-axis, situated halfway the width W of the second cutout C2, indicated by reference "M" in FIG. 5(a), and
  ii) a second distance "Zs" being the distance measured in the thickness direction Z between the star and the electrical conductor, see e.g. FIG. 5(d), or more precisely, the distance between the star and a plane tangential to the upper surface of the electrical conductor.

FIG. 5 and FIG. 6 and FIG. 7 are similar, except that:
in FIG. 5(a) to FIG. 5(e) the sensor elements of the sensor device are spaced apart by a distance dx smaller than the width W of the second cutout C2, thus dx<W, e.g. at least 0.1 mm smaller;
in FIG. 6(a) to FIG. 6(e) the sensor elements of the sensor device are spaced apart by a distance dx substantially equal to the width W of the second cutout C2, thus dx=W;
in FIG. 7(a) to FIG. 7(e) the sensor elements of the sensor device are spaced apart by a distance dx larger than the width W of the second cutout C2, thus dx>W, for example at least 0.1 mm larger.

The value of dx may be a value in the range from 0.5 mm to 3.0 mm, or from 1.0 mm to 2.5 mm, or from 1.5 mm to 2.2 mm, e.g. equal to about 1.9 mm.

According to principles of the present invention, the values ds and Zs have to be chosen such that the reference point (the star in the drawings) needs to be located in the "sweet zone" of that electrical conductor, which will be described further.

In FIG. 5(d) the first distance ds is substantially equal to 0, hence the two sensor elements will both be situated above the second cutout C2, equally far from the "middle" M.

In FIG. 5(e) the first distance ds is different from 0, for example at least 0.1 mm. If ds<(W/2−dx/2) both sensor elements will be situated above the second cutout C2. If ds>(W/2−dx/2) but not too large, one sensor element will be situated above the second cutout C2 and the other sensor element will be situated above the electrical conductor.

In FIG. 6(d) the first distance ds is substantially equal to 0, hence the two sensor elements will both be situated substantially above edges of the electrical conductors.

In FIG. 6(e) the first distance ds is different from 0, for example at least 0.1 mm. If ds<W/2, one sensor element will be situated above the second cutout and the other sensor element will be situated above the electrical conductor. If ds>W/2, both sensor elements will be situated above electrical conductors.

In FIG. 7(d) the first distance ds is substantially equal to 0, hence the two sensor elements will both be situated above electrical conductors.

In FIG. 7(e) the first distance ds is different from 0, for example at least 0.1 mm. If ds>(W/2−dx/2), but not too large, one sensor element will be situated above the second cutout C2, and the other sensor element will be situated above the electrical conductor.

The main purpose of FIG. 5 to FIG. 7 is to illustrate (at high-level) how the position of the sensor device can be defined by specifying a value for the first distance "ds" and the second distance "Zs", and to show that the value of ds may be equal to zero or may be different from 0, and to show that the value of dx may be equal to, smaller than or larger than the width W of the second cut-out. From a theoretical point of view, the position of the individual sensor elements is interesting to know, but from a practical or implementation point of view, that is not really relevant.

FIG. 8(a) shows a current sensor arrangement 800 similar to those shown in FIG. 5 to FIG. 7, where the reference point R of the sensor device 802 is located at a first distance "ds" from the middle M of the second cut-out measured in the X-direction, and is located at a second distance "Zs" from the top surface of the electrical conductor 801 measured in the Z-direction.

FIG. 8(b) shows an exemplary graph with a dashed curve representing locations in the XZ-plane where the magnetic field difference signal ΔBx induced by an AC current of 2 kHz has a zero phase shift with respect to the magnetic field difference ΔBx signal measured at the same location, but induced by an AC current of 100 Hz. The graph also shows two other curves, one showing locations in the XZ-plane where said phase shift is +2°, and another where said phase shift is −2°. Thus, the area or zone or region between these two curves defines locations where said phase shift is smaller than 2° in absolute value.

A similar graph (not shown in FIG. 8, but see e.g. FIG. 9(b)) can be made to show a curve in the XZ plane where the magnetic field difference signal ΔBx induced by an AC current of 2 kHz has a zero attenuation with respect to the magnetic field difference signal ΔBx measured at the same location, but induced by an AC current of 100 Hz, and a curve where said attenuation deviates by +2%, and a curve where said attenuation deviates by −2%. The latter two curves define a region or a zone where the amplitude of the signal ΔBx at 2 kHz deviates at most +/−2% from the amplitude of the signal ΔBx at 100 Hz.

It was further found that, although the "zero phase shift curve" and the "zero attenuation curve" do not exactly coincide, they are located surprisingly close together. Or stated in other words, it was found that the "+/−2% attenuation region" and the "+/−2° phase shift region" have a significant overlap. This overlap region is also referred to herein as the "sweet zone" (in analogy with "sweet spot").

From the above, it can be understood that, when the reference point R of the sensor device is located in the overlapping region, the phase of ΔBx at 2 kHz deviates less than +/−2° from the phase of ΔBx at 100 Hz, and at the same time, the gain (or attenuation) of ΔBx at 2 kHz deviates less than +/−2% from the gain (or attenuation) of ΔBx at 100 Hz, and the same is true for all frequencies between 100 Hz and 2 kHz, and hence the current sensor device located in the overlapping region has an excellent AC behaviour.

Based on these insights, the inventors have performed a relatively large amount of simulations, to get a better idea of the size and shape and location of the "sweet zone" for electrical conductors having a thickness T ranging from 1 to 4 mm, and comprising three identical cutouts C1, C2, C3 having a cutout length L of (Wo/2+2) mm and a cutout width W ranging from 1 to 5 mm spaced apart by a spacing SP ranging from 3 to 10 mm, used in combination with a sensor device having two sensor locations spaced apart by a distance dx of 1.9 mm, located at a distance Ys=Wo/2 from the first side of the electrical conductor (as shown e.g. in FIG. 5(a)), but of course, the present invention is not limited to these particular simulations. The techniques presented herein are also applicable to other cases, and the results may be similar.

For the sake of completeness, at least the following combination of parameters are envisioned:

| dx = 0.5 to 3.0 mm | T = 1 to 4 mm | W = 1 to 5 mm | SP = 3 to 10 mm |
|---|---|---|---| and also the following combination of parameters:

| dx = 1.0 to 2.5 mm | T = 1 to 4 mm | W = 1 to 5 mm | SP = 3 to 10 mm |
|---|---|---|---| and also the following combination of parameters, where dx<W:

| dx = 1.0 to 1.9 mm | T = 1 to 4 mm | W = 2.0 to 5.0 mm | SP = 3 to 10 mm |
|---|---|---|---|
| dx = 1.0 to 2.4 mm | T = 1 to 4 mm | W = 2.5 to 5.0 mm | SP = 3 to 10 mm |

The following tables explicitly list a number of specific combinations:

TABLE 1

(for T = 1 mm)

| dx [mm] | T [mm] | W [mm] | SP [mm] | label |
|---|---|---|---|---|
| 1.0 to 2.5 | 1 | 1 | 3 | t1w1sp3 |
| 1.0 to 2.5 | 1 | 1 | 4 | t1w1sp4 |
| 1.0 to 2.5 | 1 | 1 | 5 | t1w1sp5 |
| 1.0 to 2.5 | 1 | 1 | 6 | t1w1sp6 |
| 1.0 to 2.5 | 1 | 1 | 8 | t1w1sp8 |
| 1.0 to 2.5 | 1 | 1 | 10 | t1w1sp10 |
| 1.0 to 2.5 | 1 | 2 | 3 | t1w2sp3 |
| 1.0 to 2.5 | 1 | 2 | 4 | t1w2sp4 |
| 1.0 to 2.5 | 1 | 2 | 5 | t1w2sp5 |
| 1.0 to 2.5 | 1 | 2 | 6 | t1w2sp6 |
| 1.0 to 2.5 | 1 | 2 | 8 | t1w2sp8 |
| 1.0 to 2.5 | 1 | 2 | 10 | t1w2sp10 |
| 1.0 to 2.5 | 1 | 3 | 3 | t1w3sp3 |
| 1.0 to 2.5 | 1 | 3 | 4 | t1w3sp4 |
| 1.0 to 2.5 | 1 | 3 | 5 | t1w3sp5 |
| 1.0 to 2.5 | 1 | 3 | 6 | t1w3sp6 |
| 1.0 to 2.5 | 1 | 3 | 8 | t1w3sp8 |
| 1.0 to 2.5 | 1 | 3 | 10 | t1w3sp10 |
| 1.0 to 2.5 | 1 | 4 | 3 | t1w4sp3 |
| 1.0 to 2.5 | 1 | 4 | 4 | t1w4sp4 |
| 1.0 to 2.5 | 1 | 4 | 5 | t1w4sp5 |
| 1.0 to 2.5 | 1 | 4 | 6 | t1w4sp6 |
| 1.0 to 2.5 | 1 | 4 | 8 | t1w4sp8 |
| 1.0 to 2.5 | 1 | 4 | 10 | t1w4sp10 |
| 1.0 to 2.5 | 1 | 5 | 3 | t1w5sp3 |
| 1.0 to 2.5 | 1 | 5 | 4 | t1w5sp4 |
| 1.0 to 2.5 | 1 | 5 | 5 | t1w5sp5 |
| 1.0 to 2.5 | 1 | 5 | 6 | t1w5sp6 |
| 1.0 to 2.5 | 1 | 5 | 8 | t1w5sp8 |
| 1.0 to 2.5 | 1 | 5 | 10 | t1w5sp10 |

TABLE 2

(for T = 2 mm)

| dx [mm] | T [mm] | W [mm] | SP [mm] | label |
|---|---|---|---|---|
| 1.0 to 2.5 | 2 | 1 | 3 | t2w1sp3 |
| 1.0 to 2.5 | 2 | 1 | 4 | t2w1sp4 |
| 1.0 to 2.5 | 2 | 1 | 5 | t2w1sp5 |
| 1.0 to 2.5 | 2 | 1 | 6 | t2w1sp6 |
| 1.0 to 2.5 | 2 | 1 | 8 | t2w1sp8 |
| 1.0 to 2.5 | 2 | 1 | 10 | t2w1sp10 |
| 1.0 to 2.5 | 2 | 2 | 3 | t2w2sp3 |
| 1.0 to 2.5 | 2 | 2 | 4 | t2w2sp4 |
| 1.0 to 2.5 | 2 | 2 | 5 | t2w2sp5 |
| 1.0 to 2.5 | 2 | 2 | 6 | t2w2sp6 |
| 1.0 to 2.5 | 2 | 2 | 8 | t2w2sp8 |
| 1.0 to 2.5 | 2 | 2 | 10 | t2w2sp10 |
| 1.0 to 2.5 | 2 | 3 | 3 | t2w3sp3 |
| 1.0 to 2.5 | 2 | 3 | 4 | t2w3sp4 |
| 1.0 to 2.5 | 2 | 3 | 5 | t2w3sp5 |
| 1.0 to 2.5 | 2 | 3 | 6 | t2w3sp6 |
| 1.0 to 2.5 | 2 | 3 | 8 | t2w3sp8 |
| 1.0 to 2.5 | 2 | 3 | 10 | t2w3sp10 |
| 1.0 to 2.5 | 2 | 4 | 3 | t2w4sp3 |
| 1.0 to 2.5 | 2 | 4 | 4 | t2w4sp4 |
| 1.0 to 2.5 | 2 | 4 | 5 | t2w4sp5 |
| 1.0 to 2.5 | 2 | 4 | 6 | t2w4sp6 |
| 1.0 to 2.5 | 2 | 4 | 8 | t2w4sp8 |
| 1.0 to 2.5 | 2 | 4 | 10 | t2w4sp10 |
| 1.0 to 2.5 | 2 | 5 | 3 | t2w5sp3 |
| 1.0 to 2.5 | 2 | 5 | 4 | t2w5sp4 |
| 1.0 to 2.5 | 2 | 5 | 5 | t2w5sp5 |
| 1.0 to 2.5 | 2 | 5 | 6 | t2w5sp6 |
| 1.0 to 2.5 | 2 | 5 | 8 | t2w5sp8 |
| 1.0 to 2.5 | 2 | 5 | 10 | t2w5sp10 |

TABLE 4

(for T = 4 mm)

| dx [mm] | T [mm] | W [mm] | SP [mm] | label |
|---|---|---|---|---|
| 1.0 to 2.5 | 4 | 1 | 3 | t4w1sp3 |
| 1.0 to 2.5 | 4 | 1 | 4 | t4w1sp4 |
| 1.0 to 2.5 | 4 | 1 | 5 | t4w1sp5 |
| 1.0 to 2.5 | 4 | 1 | 6 | t4w1sp6 |
| 1.0 to 2.5 | 4 | 1 | 8 | t4w1sp8 |
| 1.0 to 2.5 | 4 | 1 | 10 | t4w1sp10 |
| 1.0 to 2.5 | 4 | 2 | 3 | t4w2sp3 |
| 1.0 to 2.5 | 4 | 2 | 4 | t4w2sp4 |
| 1.0 to 2.5 | 4 | 2 | 5 | t4w2sp5 |
| 1.0 to 2.5 | 4 | 2 | 6 | t4w2sp6 |
| 1.0 to 2.5 | 4 | 2 | 8 | t4w2sp8 |
| 1.0 to 2.5 | 4 | 2 | 10 | t4w2sp10 |
| 1.0 to 2.5 | 4 | 3 | 3 | t4w3sp3 |
| 1.0 to 2.5 | 4 | 3 | 4 | t4w3sp4 |
| 1.0 to 2.5 | 4 | 3 | 5 | t4w3sp5 |
| 1.0 to 2.5 | 4 | 3 | 6 | t4w3sp6 |
| 1.0 to 2.5 | 4 | 3 | 8 | t4w3sp8 |
| 1.0 to 2.5 | 4 | 3 | 10 | t4w3sp10 |
| 1.0 to 2.5 | 4 | 4 | 3 | t4w4sp3 |
| 1.0 to 2.5 | 4 | 4 | 4 | t4w4sp4 |
| 1.0 to 2.5 | 4 | 4 | 5 | t4w4sp5 |
| 1.0 to 2.5 | 4 | 4 | 6 | t4w4sp6 |
| 1.0 to 2.5 | 4 | 4 | 8 | t4w4sp8 |
| 1.0 to 2.5 | 4 | 4 | 10 | t4w4 sp10 |
| 1.0 to 2.5 | 4 | 5 | 3 | t4w5sp3 |
| 1.0 to 2.5 | 4 | 5 | 4 | t4w5sp4 |
| 1.0 to 2.5 | 4 | 5 | 5 | t4w5sp5 |
| 1.0 to 2.5 | 4 | 5 | 6 | t4w5sp6 |
| 1.0 to 2.5 | 4 | 5 | 8 | t4w5sp8 |
| 1.0 to 2.5 | 4 | 5 | 10 | t4w5sp10 |

TABLE 3

(for T = 3 mm)

| dx [mm] | T [mm] | W [mm] | SP [mm] | label |
|---|---|---|---|---|
| 1.0 to 2.5 | 3 | 1 | 3 | t3w1sp3 |
| 1.0 to 2.5 | 3 | 1 | 4 | t3w1sp4 |
| 1.0 to 2.5 | 3 | 1 | 5 | t3w1sp5 |
| 1.0 to 2.5 | 3 | 1 | 6 | t3w1sp6 |
| 1.0 to 2.5 | 3 | 1 | 8 | t3w1sp8 |
| 1.0 to 2.5 | 3 | 1 | 10 | t3w1sp10 |
| 1.0 to 2.5 | 3 | 2 | 3 | t3w2sp3 |
| 1.0 to 2.5 | 3 | 2 | 4 | t3w2sp4 |
| 1.0 to 2.5 | 3 | 2 | 5 | t3w2sp5 |
| 1.0 to 2.5 | 3 | 2 | 6 | t3w2sp6 |
| 1.0 to 2.5 | 3 | 2 | 8 | t3w2sp8 |
| 1.0 to 2.5 | 3 | 2 | 10 | t3w2sp10 |
| 1.0 to 2.5 | 3 | 3 | 3 | t3w3sp3 |
| 1.0 to 2.5 | 3 | 3 | 4 | t3w3sp4 |
| 1.0 to 2.5 | 3 | 3 | 5 | t3w3sp5 |
| 1.0 to 2.5 | 3 | 3 | 6 | t3w3sp6 |
| 1.0 to 2.5 | 3 | 3 | 8 | t3w3sp8 |
| 1.0 to 2.5 | 3 | 3 | 10 | t3w3sp10 |
| 1.0 to 2.5 | 3 | 4 | 3 | t3w4sp3 |
| 1.0 to 2.5 | 3 | 4 | 4 | t3w4sp4 |
| 1.0 to 2.5 | 3 | 4 | 5 | t3w4sp5 |
| 1.0 to 2.5 | 3 | 4 | 6 | t3w4sp6 |
| 1.0 to 2.5 | 3 | 4 | 8 | t3w4sp8 |
| 1.0 to 2.5 | 3 | 4 | 10 | t3w4sp10 |
| 1.0 to 2.5 | 3 | 5 | 3 | t3w5sp3 |
| 1.0 to 2.5 | 3 | 5 | 4 | t3w5sp4 |
| 1.0 to 2.5 | 3 | 5 | 5 | t3w5sp5 |
| 1.0 to 2.5 | 3 | 5 | 6 | t3w5sp6 |
| 1.0 to 2.5 | 3 | 5 | 8 | t3w5sp8 |
| 1.0 to 2.5 | 3 | 5 | 10 | t3w5sp10 |

FIG. 9(a) shows a plurality of plots, similar to that of FIG. 8(b), showing locations in the XZ plane where the phase shift between the signal ΔBx induced by a sinusoidal current at 2 kHz relative to the signal ΔBx induced by a sinusoidal current at 100 Hz is 0° (dashed line) or +2° or −2° (solid lines). In each of these plots, the horizontal axis is the X-axis, and the vertical axis is the Z-axis, in millimeters. The label "t3w1sp3" means that T=3 mm, W=1 mm and SP=3 mm", the label "t3w2sp4" means that T=3 mm, W=2 mm and SP=4 mm, etc.

FIG. 9(b) shows a plurality of graphs, similar to those of FIG. 9(a), showing locations in the XZ plane, where the gain variation between the signal ΔBx induced by an AC current at 2 kHz relative to the signal ΔBx induced by an AC current at 100 Hz is 0% (dashed line) or +2% or −2% (solid lines). In each of these plots, the horizontal axis is the X-axis, and the vertical axis is the Z-axis, in millimeters. Again, the label "t3w2sp4" means that T=3 mm, W=2 mm and SP=4 mm", etc.

Comparison of corresponding graphs of FIG. 9(a) and FIG. 9(b) shows that the zero-phase shift curves and the zero gain variation curves are located closely together, and that the +/−2° phase shift regions and the +/−2% attenuation variation regions overlap.

What this means is that, and it came as a real surprise that there exists a region where a measurement of ΔBx is highly insensitive (within a predefined tolerance margin of e.g. +/−2%) to the frequency of the AC current, for AC currents having one or more frequencies ranging from about 100 Hz to about 2 kHz, meaning that the AC current can be determined with high accuracy by simply multiplying the magnitude of the signal ΔBx by a predefined constant, which is independent of the frequency of the current, without having to perform spectral analysis, e.g. Fourier analysis or the like. This allows the AC current to be measured with relatively simple hardware, and to take measurements without a significant delay, thus allowing a relatively high sampling rate. These advantages cannot be underestimated.

As can be appreciated, it may even be possible to find locations where the variation is less than +/−1.5% or even less than +/−1.0%, or even less than 0.5%.

Likewise, for systems where an absolute accuracy of +/−2% is not required but may for example be +/−3% or +/−4% or +/−5%, the regions will be even larger.

Similar simulations as shown in FIG. 9(a) and FIG. 9(b) were also done for T=1 mm, T=2 mm and T=4 mm, showing very similar results, in the sense that also in this case a "+/−2% attenuation region" and a "+/−2° phase shift region" exists, which regions substantially overlap.

The inventors went even one step further and came up with a mathematical model to describe these "sweet zones". FIG. 10 shows that the graphs of FIG. 9(a) and FIG. 9(b) can be divided in three groups:

A first group 1001 contains the graphs of t3w1sp3 and t3w2sp3, which graphs can be modelled by a rectangular area (model 1a), which can be expressed mathematically by the following set of equations:

$$\begin{cases} ds <= X0 & [1] \\ zs <= Z0 & [2] \end{cases}$$

where X0 is a predefined constant corresponding to the intersection of the upper solid curve with the X-axis, and Z0 is a predefined constant corresponding to the intersection of the upper solid curve with the Z-axis.

Alternatively, the sweet region of group 1001 can also be modelled by the area under a curve which can be described by the following equation:

$$(x/X0)^3 + (z/Z0)^3 = 1 \quad [3]$$

where X0 is a predefined constant corresponding to the intersection of the upper solid curve with the X-axis, and Z0 is a predefined constant corresponding to the intersection of the upper solid curve with the Z-axis.

A second group 1002 of graphs can be modelled by the area under a curve which can be described by the equation $$(x/X0)^2 + (z/Z0)^2 = 1 \quad [4]$$

which is the formula of an ellipse, where X0 and Z0 are predefined constants, having the same meaning as above.

Optionally this "elliptical region" can be reduced by stating that zs needs to be larger than a predefined constant Z1 equal to about 0.5 in case of t3w3sp3, t3w4sp3 and t3w5sp3; or needs to be larger than a predefined constant Z2 equal to about 1.0 in case of t3w4sp4 and t3w5sp4.

A third group of graphs 1003 containing the remaining graphs can be modelled by a third model directed to the area between an upper curve which can be described by a first equation $$(x/Xu)^2 + (z/Zu)^2 = 1 \quad [5]$$

and a lower curve which can be described by a second equation $$(x/XL)^{1.5} + (Z/ZL)^{1.5} = 1 \quad [6]$$

where Xu and Zu are predefined constants representing the intersections of the upper curve with the X and Z axis respectively, and where XL and ZL are predefined constants representing the intersections of the lower curve with the X and Z axis respectively.

The above mentioned "predefined constants" can for example be determined by simulations, or can be estimated or approximated by "curve fitting" (as will be explained further), or may be determined in any other suitable way.

The same or similar models can also be used for the graphs of T=1, T=2 and T=4. As mentioned above, these graphs look very similar to those of FIG. 9(a) and FIG. 9(b), but the values of X0, Z0, Xu, Zu, XL, ZL are slightly different.

FIG. 11(a) shows all the "zero-phase-shift curves" (i.e. the dashed lines) for T=2 mm, W=1 to 5 mm, and SP=3 to 10 mm in a single graph. As can be seen, most of these curves have an elliptical shape, except for some of the lower ones, which do not belong to the third group 1003 of FIG. 10. The intersections X0 with the horizontal axis and the intersections Z0 with the vertical axis were determined, and a correlation was found with a predefined function, more specifically a linear expression of the parameters W and SP, shown in FIG. 11(b) and FIG. 11(c).

FIG. 11(b) shows that the values of X0 on the vertical axis show a high correction with the expression (W/2+SP/10) on the horizontal axis. The following function can thus be used to approximate or estimate the values of X0 for an electrical conductor with a thickness T=2 mm, and for a given W and SP value:

$$X0=-0.21+0.97*(W/2+SP/10) \quad [7a],$$

or in general:

$$X0=Ax+Bx*W+Cx*SP \quad [7b],$$

where Ax, Bx and Cx are predefined constants.

While the curves for T=1, T=3 and T=4 are slightly different from those of T=2, formula [7b] can still be used for estimating the values of X0 as a function of W and SP, using suitable parameters for Ax, Bx and Cx.

FIG. 11(c) shows that the values of Z0 on the vertical axis show a good correction with the expression (W/2+SP) on the horizontal axis. The following function can thus be used to approximate or estimate the values of Z0 for an electrical conductor with a thickness T=2 mm, and for a given W and SP value:

$$Z0=-1.67+0.47*(W/2+SP) \quad [8a]$$

or in general:

$$Z0=Az+Bz*W+Cz*SP \quad [8b],$$

where Ax, Bx and Cx are predefined constants.

Again, while the curves for T=1, T=3 and T=4 are slightly different from those of T=2, formula [8b] can still be used as an estimating the values of Z0 as a function of W and SP, using suitable parameters for Az, Bz and Cz.

Once the value of X0 and Z0 are known, e.g. calculated using formula [7a, 7b] and [8a, 8b] based on the geometric parameters of the electrical conductor having the three cutouts (also called "slits"), the values X0 and Z0 can be used in the equations [1] to [6] above to estimate the location of the "zero-phase-shift curve" and/or the "zero-attenuation curve" and/or the "+/−2% attenuation zone" and/or the "+/−2% phase shift zone" and/or the "sweet zone" being the overlap thereof, or the "sweet zone" for another accuracy-value, e.g. +/−3% or +/−4% or +/−5%.

For example, the "zero phase shift curve" for embodiments of the third group 1003, that is (T=1 to 4) and (SP=4) and (W=1 to 3), or(T=1 to 4) and (W=1 to 5) and (SP=5 to 10) can be approximated by a curve according to the following equation:

$$(Zs/Z0)^2+(ds/X0)^2=1 \quad [9a], \text{ with}$$

$$Z0=Az+Bz*W+Cz*SP \quad [9b]=[8b],$$

$$X0=Ax+Bx*W+Cx*SP \quad [9c]=[7b],$$

where Ax, Bx, Cx, Az, Bz, Cz are predefined constants.

But as explained above, a current sensor system with a "good" AC behaviour is also obtained if the sensor device is located somewhat offset from the "zero-phase shift curve", or stated in other words, for (ds,Zs) pairs that are not exactly located on the curve [9a-9c], but are located somewhat higher or somewhat lower than the zero-phase shift curve. As can be seen in FIG. 9(a) and FIG. 9(b) the ΔZ range between the +/−2% curves decreases as W increases, and can be approximated by the following formula:

$$\Delta Z=(ds/X0)*W/N, \quad [10]$$

where N is an integer value in the range from 1 to 5, for example equal to 1 or 2 or 3 or 4 or 5, depending on the desired accuracy. The larger the number N, the smaller the deviation from the zero phase shift curve, the better the accuracy.

The formulas ([7a] or [7b]) and ([8a] or [8b]) may also be used to perform some simple calculations, e.g. to get a first impression of suitable parameters for T, W and SP when designing an electrical conductor with three cut-outs. But of course, once the dimensions of the electrical conductor are fixed, more accurate results can be obtained by performing simulations for the specific parameters chosen, e.g. as shown in FIG. 9(a) and FIG. 9(b).

As an example, when it is envisioned to mount the sensor device on top of a printed circuit board (PCB) facing away from the electrical conductor, such that the reference point R will be situated at a distance of about 2.5 mm from the upper surface of the electrical conductor, formula [8a] or [8b] can be used to find/estimate a set of candidate W and SP values. In this way, the number of simulations to find a good solution can be drastically limited.

As another example, when it is envisioned to mount the sensor device at the bottom of a printed circuit board (PCB) facing the electrical conductor, such that the reference point R will be situated at a distance of about 1.0 mm from the upper surface of the electrical conductor, formula [8a] or[8b] can be used to find/estimate another set of candidate W and SP values.

Again, the results in FIG. 11(a) to FIG. 11(c) reflect the result of simulations performed for electrical conductors having a thickness T=2 mm, but of course the present invention is not limited thereto, and similar graphs and formulas can also be provided for other T values in the range from 1 to 4 mm.

While the graphs of FIG. 9(a) and FIG. 9(b) show curves for +/−2% gain variation and for +/−2° phase shift, it shall be clear that similar graphs can also be shown for +/−3% gain variation and +/−3° phase shift, or for +/−4% gain variation and +/−4° phase shift, or for +/−5% gain variation and +/−5° phase shift. It will also be understood that the overlap (or sweet zone) for +/−5% gain variation and +/−5° phase shift will be larger than the overlap (or sweet zone) for +/−4% gain variation and +/−4% phase shift, which in turn will be larger than the overlap (or sweet zone) or for +/−3% gain variation and +/−3% phase shift, which will be larger than the overlap (or sweet zone) or for +/−2% gain variation and +/−2% phase shift.

FIG. 12 shows an electrical block-diagram of a circuit 1210 that can be used in embodiments of the present invention, e.g. in the current sensor devices 502, 602, 702 described above. This block-diagram does not necessarily contain a temperature sensor or a stress sensor.

The processing unit 1230 is adapted for determining the AC current to be measured by calculating the current according to the formula: I=K·(v1−v2), where K is a predefined constant, independent of the frequency of the current to be measured. The value of K can for example be determined during design, by simulation, or during an evaluation phase, v1 is the signal or value provided by the first magnetic sensor 1211 (or a signal or a value derived therefrom, e.g. after amplification), and v2 is the signal or value provided by the second magnetic sensor 1221 (or a signal or a value derived therefrom, e.g. after amplification). The subtraction of v1 and v2 may be done in hardware before amplification or after amplification or can be performed in the digital domain. The processing unit 1230 may comprise a digital processor comprising or connected to a non-volatile memory 1231 (e.g. flash memory) storing said constant value K.

While not explicitly shown, the processing circuit 1230 may comprise a differential amplifier configured for determining and amplifying a difference between the first value v1 and the second value v2, and for amplifying this difference in the analogue domain. Alternatively, the processing circuit 1230 may comprise an amplifier configured for selectively amplifying the first value v1 and the second value v2. The sensor device 1210 may further comprise an analog-to-digital convertor ADC configured for digitizing the individual signals v1, v2 or the amplified difference signal. The ADC may be part of a digital processor circuit.

The current to be measured may be provided as an analog output signal proportional to the current, or may be provided as a digital signal indicative of the current to be measured, for example via a digital data interface, for example via a serial data bus (e.g. using the I2C protocol, or using RS232 protocol, or any other suitable protocol).

FIG. 13 shows an electrical block-diagram of a sensor device 1310 which can be seen as a variant of the sensor device 1210 of FIG. 12, further comprising a first and a second temperature sensor 1312, 1322, communicatively connected to the processing unit 1330. The processing unit 1330 is adapted for determining the current to be measured based on the values v1 and v2, but taking into account one or both of the temperature signals or values t1, t2. The measured temperature(s) can be taken into account for compensating the measurement values v1, v2 for temperature variations, e.g. to compensate for sensitivity variations of the magnetic sensor elements. Such compensation techniques are known per se in the art, and hence need not be explained in more detail here. It is an advantage of the current sensor device 1330 that it includes a temperature compensation mechanism. In this way, the accuracy of the current measurement can be further improved. For example, in a particular embodiment, a temperature compensation is performed in a manner similar as described in EP3109658 (A1), which is incorporated herein by reference in its entirety.

The processing unit 1230 of FIG. 12 and 1330 of FIG. 13 may contain a digital processor, for example a programmable microcontroller. Although not explicitly shown, the circuit 1210 and 1310 may also contain at least one analog-to-digital convertor, which may be part of the magnetic sensors, or may be part of the processing unit, or may be implemented as a separate circuit (e.g. between an output of the sensor circuit and an input of the processing unit). The block diagram of FIG. 12 and FIG. 13 does not show this level of detail, for the same reasons as it does not show a biasing circuit, a readout circuit, an optional amplifier, a power supply, etc., which are all well known in the art, and hence need not be described in detail here.

It is noted in this respect that if the signals v1, v2, t1 and t2 are analog signals, the processing unit 1330 may contain at least one ADC to convert these signals into digital signals, whereas in case the signals v1, v2, t1 and t2 are digital signals, the processing unit 1330 need not have an ADC.

It is an advantage of embodiments with two temperature sensors, one for each magnetic sensor, because the temperature of the first and second magnetic sensor may be substantially different, especially if a relatively high current is being measured in close vicinity of the electrical conductor, because such a high current typically causes the electrical conductor to warm up significantly, causing a relatively large temperature gradient over the substrate of the sensor device. In this way the accuracy of the current measurement can be further improved.

In a variant (not shown) of FIG. 13, the circuit comprises only one temperature sensor, which may be arranged for measuring the temperature of the first magnetic sensor, or for measuring the temperature of the second magnetic sensor. The temperature of the other magnetic sensor may then be estimated based on the estimated power dissipation (in turn based on v1 and v2) and/or based on a predefined assumption of the ambient temperature, instead of actually measuring the other temperature. Of course, an embodiment with two temperature sensors is typically more accurate.

In another or a further variant, the circuit comprises one or two mechanical stress sensors instead of one or two temperature sensors, and the processing unit 1330 may be adapted for determining the current based on the values obtained from the magnetic sensors, taking into account the mechanical stress value(s) obtained from one or both stress sensors.

In another or a further variant, the circuit additionally comprises one or two mechanical stress sensors in addition to one or two temperature sensors, and the processing unit 1330 is adapted for determining the AC current based on the values obtained from the magnetic sensors and the one or more temperature sensors and the one or more stress sensors.

In an embodiment, each magnetic sensor element has an associated temperature sensor and an associated mechanical stress sensor, and the processing circuit is configured for measuring the two magnetic signals, and for measuring the two temperatures, and for measuring the two mechanical stress values, and is configured for determining $\Delta Bx = Bx1 - Bx2$, and for multiplying the value $\Delta Bx$ by a predefined constant factor K (independent of frequency), and for compensating the result for temperature and/or mechanical stress, for example using a polynomial expression of the temperature and/or stress, for example in a manner as described in EP3109658(A1), incorporated herein by reference in its entirety.

In another or a further embodiment, the sensor device comprises: a semiconductor substrate comprising a first and a second magnetic sensor element; a first and a second biasing means (e.g. a first current source and a second current source, at least one of which may be adjustable or configurable) for biasing the first and the second magnetic sensor element; a first and a second amplifier for amplifying the signals provided by the first and the second magnetic sensor element (at least one of the amplifiers may have a configurable or adjustable gain); an analog-to-digital convertor (ADC) for digitizing the first and the second sensor signal or a signal derived therefrom; and a processing circuit having an input connected to an output of the ADC. This sensor device further comprises at least one of: (i) a temperature sensor (e.g. a single temperature sensor) for measuring a temperature of the semiconductor substrate, and (ii) two mechanical stress sensors, or a differential stress sensor for measuring a differential stress exerted upon the first and second magnetic sensor.

Various examples of hardware block-diagrams are shown in FIG. 3(a) to FIG. 5(f) of co-pending patent application EP20165059.5 filed on 23 Mar. 2020 by the same applicant, incorporated herein by reference in its entirety. The EP'059 application also describes methods for determining the magnetic field gradient or magnetic field difference in a manner which is highly insensitive to a common mode value. The same problem is relevant for the present invention, where an AC current is to be determined based on a difference of two magnetic field components Bx1, Bx2, especially if "ds" is different from 0. Thus, in an embodiment of the present invention, the hardware and the method as described in EP'059 is used and combined with the positioning of the sensor device relative to the electrical conductor in the "sweet zone" as described in the present application, providing a current sensor system for measuring an AC current, with even higher accuracy, by furthermore reducing or even completely eliminating a common mode portion of the individual magnetic field signals.

FIG. 14(a) is a schematic representation of an exemplary sensor device with two vertical Hall elements V1, V2, as can be used in embodiments of the present invention. The sensor device may further comprise bond pads (indicated by black squares), etc. in manners known in the art.

So far, the present invention is described mainly using vertical Hall elements as the magnetic sensitive elements for measuring the magnetic field component Bx1 and Bx2, but the present invention is not limited thereto, and other magnetic sensor elements or magnetic sensor structures can also be used, for example Magneto-Resistive sensor elements (e.g. AMR, GMR, xMR, TMR), e.g. arranged in a wheatstone bridge, or horizontal Hall elements optionally with integrated magnetic concentrators (IMC).

FIG. 14(b) is a schematic representation of an exemplary sensor device with two horizontal Hall elements H1, H2 and integrated magnetic concentrators (IMC), as can be used in embodiments of the present invention. The first Hall element H1 is configured for measuring Bx1 oriented in the X-direction at a first sensor location, and the second Hall element H2 is configured for measuring Bx2 oriented in the X-direction at a second sensor location, spaced apart from the first sensor location. If the signals provided by the first, second Hall element are HH1, HH2 respectively, then HH1-HH2 yields ΔBx, and the Bz component is cancelled.

FIG. 14(c) is a variant of FIG. 14(b) wherein the sensor device has four horizontal Hall elements H1a, H1b, H2a and H2b and integrated magnetic concentrators (IMC), as can be used in embodiments of the present invention. In this device, the signals from the first and second Hall element H1a and H1b are combined to form the first signal Bx1, and the signals from the third and fourth Hall element H2a, H2b are combined to form the second signal Bx2. In this way the signal amplitude of the individual sensor elements can be substantially doubled, yielding a better signal-to-noise ratio (SNR). If the signals provided by H1a, H1b, H2a, H2b are HH1a, HH1b, HH2a, HH2b respectively, then (HH1a-HH1b)-(HH2a-HH2b) yields ΔBx, and the Bz component is cancelled at each sensing spot.

While in most of the examples illustrated above, the sensor device is typically located at a Y-position equal to Wo/2 and each of the three cut-outs have an equal length (in the Y-direction) larger than Wo/2, that is not absolutely required for the invention to work, and a "sweet zone" can also be found if the first and third cut-out would e.g. have a length of about 65% of Wo (in the Y-direction) and the second cut-out would have a length of about 40% (hence 5% overlap in the Y-direction), and the sensor device would be spaced about 62.5% of Wo from the first side S1 (i.e. 37.5% of Wo from the second side S2), which can be written as L1=L3=Wo*65% and L2=Wo*40% and Ys=Wo*62.5%.

The skilled person having the benefit of the present disclosure can easily find other working solutions, e.g. L1=L3=Wo*76% and L2=Wo*26% and Ys=Wo*75%. The location of the sweet zone for such electrical conductors can easily be found by simulations, using the techniques explained above.

In the examples illustrated above, the electrical conductor is a busbar, but the present invention is not limited thereto, and also works if the electrical conductor is formed by a single or multiple conductive paths of a printed circuit board (PCB), patterned to have a top view similar to that of the electrical conductor shown in FIG. 1(a). In case of a PCB, the above mentioned "cut-outs" may thus be formed by patterning the conductive paths rather than by removing material, and the "cut-out zone" may comprise PCB-material rather than air.

Referring back to FIG. 2(a), it can now be understood that, in some embodiments of the present invention, the distance dx between the two sensors of the sensor device, is preferably smaller than the distance between the locations "x1" and "x2" where the amplitude of the magnetic field components |Bx1| and |Bx2| reach a local maximum. As described above, the position x1 and x2 is substantially above the middle of the respective conductor portion adjacent the central cutout S2, as illustrated in FIG. 2.

The invention claimed is:

1. A current sensor arrangement for measuring an AC electrical current, comprising:
   an electrical conductor having an overall elongated shape extending in a first direction, and having a predefined overall width in a second direction, and a predefined thickness in a third direction;
   a sensor device comprising two sensor elements spaced apart by a predefined distance along the first direction, each sensor element configured for measuring a magnetic field component oriented in the first direction; and
   wherein the sensor device is configured for determining a magnetic field difference or a magnetic field gradient along the first direction based on the measured magnetic field components, and for determining said AC current based on the magnetic field gradient or magnetic field difference;
   wherein the electrical conductor comprises a first cut-out, a second cut-out, and a third cut-out, spaced apart from each other along the first direction,
   the first and the third cut-out extending in a transverse direction from a first side of the electrical conductor, the second cut-out extending in the transverse direction from a second side of the electrical conductor opposite the first side;
   wherein the sensor device is positioned relative to the electrical conductor such that a reference point of the sensor device situated in a middle between the two sensor elements is located at a first distance from a middle of the second cut-out measured in the first direction, and is located at a second distance from the electrical conductor measured in the third direction;
   wherein the second distance is a value in a range from 0.0 mm to 5.0 mm; and
   wherein the sensor device is positioned relative to the electrical conductor such that a ratio of a complex representation of the magnetic field difference or the magnetic field gradient and a complex representation of the AC current is a complex value having a substantially constant amplitude within a first predefined tolerance margin of +/−5.0%, and having a substantially constant phase within a second predefined tolerance margin of +/−5.0°, for AC currents having a frequency in predefined frequency range comprising at least a range from 100 Hz to 2 kHz.

2. The current sensor arrangement according to claim 1, wherein a projection of the reference point of the sensor device in the third direction intersects a space defined by the second cut-out.

3. The current sensor arrangement according to claim 1,
wherein a projection of each of the two sensor elements in the third direction intersects a space defined by the second cut-out; or
wherein a projection of one of the two sensor elements in the third direction intersects a space defined by the second cut-out, and wherein a projection of the other of the two sensor elements in the third direction intersects the electrical conductor; or
wherein a projection of both of the two sensor elements in the third direction intersects the electrical conductor.

4. The current sensor arrangement according to claim 1, wherein the predefined distance between the two sensor elements is a value in a range from 0.5 mm to 3.0 mm; and/or
wherein an overall width of the electrical conductor is a value in a range from 5 to 25 mm; and/or
wherein the thickness of the electrical conductor is a value in a range from 1 mm to 4 mm; and/or
wherein the first, second and third cut-out each has a cut-out width in a range from 1 mm to 5 mm; and/or
wherein a first spacing between the first cut-out and the second cut-out is a value in a range from 3 to 10 mm; and/or
wherein a second spacing between the second cut-out and the third cut-out is a value in a range from 3 to 10 mm.

5. The current sensor arrangement according to claim 1,
wherein the thickness of the electrical conductor is a value in the range from about 1 mm to about 4 mm; and
wherein a spacing between the cutouts is a value in the range from about 5 to about 10 mm and the width of the cut-outs is a value in the range from about 1 to about 5 mm, or wherein a spacing between the cutouts is equal to about 4 mm and the width of the cut-outs is a value in the range from about 1 to about 3 mm; and
wherein the first distance ds and the second distance Zs are positive values located in an area between a first curve and a second curve,
the first curve being defined by the formula: $(Zs/Zu)^2+(ds/Xu)^2=1$,
the second curve being defined by the formula: $(Zs/ZL)^{1.5}+(ds/XL)^{1.5}=1$,
wherein Zu, Xu, ZL, XL are predefined constants, which can be determined based on the geometry of the electrical conductor.

6. A current sensor arrangement for measuring an AC electrical current, comprising:
an electrical conductor having an overall elongated shape extending in a first direction, and having a predefined overall width in a second direction, and a predefined thickness in a third direction;
a sensor device comprising two sensor elements spaced apart by a predefined distance along the first direction, each sensor element configured for measuring a magnetic field component oriented in the first direction; and
wherein the sensor device is configured for determining a magnetic field difference or a magnetic field gradient along the first direction based on the measured magnetic field components, and for determining said AC current based on the magnetic field gradient or magnetic field difference;
wherein the electrical conductor comprises a first cut-out, a second cut-out, and a third cut-out, spaced apart from each other along the first direction,
the first and the third cut-out extending in a transverse direction from a first side of the electrical conductor, the second cut-out extending in the transverse direction from a second side of the electrical conductor opposite the first side;
wherein the sensor device is positioned relative to the electrical conductor such that a reference point of the sensor device situated in a middle between the two sensor elements is located at a first distance from a middle of the second cut-out measured in the first direction, and is located at a second distance from the electrical conductor measured in the third direction;
wherein the second distance is a value in a range from 0.0 mm to 5.0 mm; and
wherein the sensor device is positioned relative to the electrical conductor such that a real part of the first magnetic field component is substantially equal to a real part of the second magnetic field component within a predefined tolerance margin of +/−5.0%, and such that an imaginary part of the first magnetic field component is substantially equal to an imaginary part of the second magnetic field component within said predefined tolerance margin, for AC currents having a frequency in the predefined frequency range.

7. The current sensor arrangement according to claim 6, wherein a projection of the reference point of the sensor device in the third direction intersects a space defined by the second cut-out.

8. The current sensor arrangement according to claim 6,
wherein a projection of each of the two sensor elements in the third direction intersects a space defined by the second cut-out; or
wherein a projection of one of the two sensor elements in the third direction intersects a space defined by the second cut-out, and wherein a projection of the other of the two sensor elements in the third direction intersects the electrical conductor; or
wherein a projection of both of the two sensor elements in the third direction intersects the electrical conductor.

9. The current sensor arrangement according to claim 6,
wherein the predefined distance between the two sensor elements is a value in a range from 0.5 mm to 3.0 mm; and/or
wherein an overall width of the electrical conductor is a value in a range from 5 to 25 mm; and/or
wherein the thickness of the electrical conductor is a value in a range from 1 mm to 4 mm; and/or
wherein the first, second and third cut-out each has a cut-out width in a range from 1 mm to 5 mm; and/or
wherein a first spacing between the first cut-out and the second cut-out is a value in a range from 3 to 10 mm; and/or
wherein a second spacing between the second cut-out and the third cut-out is a value in a range from 3 to 10 mm.

10. The current sensor arrangement according to claim 6,
wherein the thickness of the electrical conductor is a value in the range from about 1 mm to about 4 mm; and
wherein a spacing between the cutouts is a value in the range from about 5 to about 10 mm and the width of the cut-outs is a value in the range from about 1 to about 5 mm, or wherein a spacing between the cutouts is equal to about 4 mm and the width of the cut-outs is a value in the range from about 1 to about 3 mm; and wherein the first distance ds and the second distance Zs are positive values located in an area between a first curve and a second curve, the first curve being defined by the formula: $(Zs/Zu)^2 + (ds/Xu)^2 = 1$, the second curve being defined by the formula: $(Zs/ZL)^{1.5} + (ds/XL)^{1.5} = 1$, wherein Zu, Xu, ZL, XL are predefined constants, which can be determined based on a geometry of the electrical conductor.

11. A current sensor arrangement for measuring an AC electrical current, comprising:

an electrical conductor having an overall elongated shape extending in a first direction, and having a predefined overall width in a second direction, and a predefined thickness in a third direction;

a sensor device comprising two sensor elements spaced apart by a predefined distance along the first direction, each sensor element configured for measuring a magnetic field component oriented in the first direction; and wherein the sensor device is configured for determining a magnetic field difference or a magnetic field gradient along the first direction based on the measured magnetic field components, and for determining said AC current based on the magnetic field gradient or magnetic field difference;

wherein the electrical conductor comprises a first cut-out, a second cut-out, and a third cut-out, spaced apart from each other along the first direction, the first and the third cut-out extending in a transverse direction from a first side of the electrical conductor, the second cut-out extending in the transverse direction from a second side of the electrical conductor opposite the first side;

wherein the sensor device is positioned relative to the electrical conductor such that a reference point of the sensor device situated in a middle between the two sensor elements is located at a first distance from a middle of the second cut-out measured in the first direction, and is located at a second distance from the electrical conductor measured in the third direction;

wherein the first distance is chosen to correspond with a location where a magnitude of said magnetic field difference or a magnitude of said magnetic field gradient is substantially constant within a predefined tolerance margin of +/−5.0% in a predefined frequency range comprising at least a range from 100 Hz to 2 kHz;

wherein the thickness of the electrical conductor is a value in a range from about 1 mm to about 4 mm; and wherein a first spacing between the first and the second cut-out and a second spacing between the second and the third cut-out is about 3 mm; and wherein a width of the first, second and third cut-out is a value in a range from about 1 to about 2 mm; and wherein the second distance is a value in a range from 0.0 mm to the value of said width; and wherein the first distance is a value in a range from 0.0 mm to a predefined constant ds2, which can be determined based on a geometry of the electrical conductor.

12. The current sensor arrangement according to claim 11, wherein a projection of the reference point of the sensor device in the third direction intersects a space defined by the second cut-out.

13. The current sensor arrangement according to claim 11, wherein a projection of each of the two sensor elements in the third direction intersects a space defined by the second cut-out; or wherein a projection of one of the two sensor elements in the third direction intersects a space defined by the second cut-out, and wherein a projection of the other of the two sensor elements in the third direction intersects the electrical conductor; or wherein a projection of both of the two sensor elements in the third direction intersects the electrical conductor.

14. A current sensor arrangement for measuring an AC electrical current, comprising:

an electrical conductor having an overall elongated shape extending in a first direction, and having a predefined overall width in a second direction, and a predefined thickness in a third direction;

a sensor device comprising two sensor elements spaced apart by a predefined distance along the first direction, each sensor element configured for measuring a magnetic field component oriented in the first direction; and wherein the sensor device is configured for determining a magnetic field difference or a magnetic field gradient along the first direction based on the measured magnetic field components, and for determining said AC current based on the magnetic field gradient or magnetic field difference;

wherein the electrical conductor comprises a first cut-out, a second cut-out, and a third cut-out, spaced apart from each other along the first direction, the first and the third cut-out extending in a transverse direction from a first side of the electrical conductor, the second cut-out extending in the transverse direction from a second side of the electrical conductor opposite the first side;

wherein the sensor device is positioned relative to the electrical conductor such that a reference point of the sensor device situated in a middle between the two sensor elements is located at a first distance ds from a middle of the second cut-out measured in the first direction, and is located at a second distance Zs from the electrical conductor measured in the third direction;

wherein the second distance Zs is a value in a range from 0.0 mm to 5.0 mm; and wherein the first distance ds is chosen to correspond with a location where a magnitude of said magnetic field difference or a magnitude of said magnetic field gradient is substantially constant within a predefined tolerance margin of +/−5.0% in a predefined frequency range comprising at least a range from 100 Hz to 2 kHz;

wherein the thickness of the electrical conductor is a value in a range from about 1 mm to about 4 mm; and wherein a spacing between the first and second cut-out and between the second and third cutout is a value in a range from about 3 to about 10 mm and the width of the cut-outs is a value in a range from about 1 to about 5 mm; and wherein the first distance ds and the second distance Zs are positive values located on a predefined curve defined by a formula: $(Zs/Z0)^2 + (ds/X0)^2 = 1$, where X0 and Z0 are predefined constants, which can be determined based on a geometry of the electrical conductor, or at locations above or below the predefined curve wherein a value of the second distance Zs may deviate from a value of the predefined curve by at most $+/-(ds/X0)*W/N$, wherein W is the width of the cut-outs, and N is an integer value in a range from 2 to 10.

15. The current sensor arrangement according to claim 14, wherein a projection of the reference point of the sensor device in the third direction intersects a space defined by the second cut-out.

16. The current sensor arrangement according to claim 14,
wherein a projection of each of the two sensor elements in the third direction intersects a space defined by the second cut-out; or
wherein a projection of one of the two sensor elements in the third direction intersects a space defined by the second cut-out, and wherein a projection of the other of the two sensor elements in the third direction intersects the electrical conductor; or
wherein a projection of both of the two sensor elements in the third direction intersects the electrical conductor.

17. A method of measuring an AC electrical current having a frequency in a predefined frequency range comprising the range from 100 Hz to 2000 Hz, using a current sensor arrangement comprising an electrical conductor and a sensor device, the method comprising the steps of:
a) measuring, by the sensor device, a first and a second magnetic field component oriented in a first direction at two different locations spaced apart along the first direction;
b) determining a difference or a gradient of these magnetic field components;
c) determining said AC current based on the magnetic field difference or gradient;
wherein the electrical conductor has an overall elongated shape extending in the first direction, and having a predefined overall width in a second direction, and a predefined thickness in a third direction;
wherein the sensor device comprises two sensor elements spaced apart by a predefined distance along the first direction;
wherein the electrical conductor comprises a first cut-out, a second cut-out, and a third cut-out, spaced apart from each other along the first direction,
the first and the third cut-out extending in a transverse direction from a first side of the electrical conductor, the second cut-out extending in the transverse direction from a second side of the electrical conductor opposite the first side;
wherein the sensor device is positioned relative to the electrical conductor such that a reference point of the sensor device situated in a middle between the two sensor elements is located at a first distance from a middle of the second cut-out measured in the first direction, and is located at a second distance from the electrical conductor measured in the third direction;
wherein the second distance is a value in a range from 0.0 mm to 5.0 mm; and
wherein the first distance is chosen to correspond with a location where a magnitude of said magnetic field difference or a magnitude of said magnetic field gradient is substantially constant within a predefined tolerance margin of +/−5.0% in a predefined frequency range comprising at least a range from 100 Hz to 2 kHz.

18. The method according to claim 17,
wherein the method further comprises step d) of measuring a temperature of one or both sensor elements and/or measuring a mechanical stress exerted upon one or both sensor elements; and
wherein step c) comprises: determining said AC current based on the magnetic field difference or magnetic field gradient, and based on one or both of said temperature and said mechanical stress.

19. The method according to claim 17,
wherein the sensor device further comprises a semiconductor substrate comprising the first and second magnetic sensor element, a first and second biasing means for biasing the first and second magnetic sensor element, a first and a second amplifier for amplifying the first and second sensor signal provided by the first and second magnetic sensor element, an analog-to-digital convertor for digitizing the first and second sensor signal or a signal derived therefrom; and
at least one of:
(i) a temperature sensor for measuring a temperature of the semiconductor substrate, and
(ii) a differential stress sensor for measuring a differential stress exerted upon the first and second magnetic sensor; and a processing means having an input port connected to an output of the ADC; and
wherein the method further comprises step d) of measuring a temperature of one or both sensor elements and/or measuring a mechanical stress exerted upon one or both sensor elements; and
wherein the method further comprises the step of:
adjusting a biasing signal and/or adjusting an amplifier gain and/or adjusting a digital value of the amplified second sensor signal, based on a predefined function of the measured temperature and/or the measured differential stress, before determining a difference between:
a first signal or a first value derived from the first sensor signal, and
a second signal or a second value derived from the second sensor signal.

20. The method according to claim 17, wherein the sensor device is an integrated circuit, and wherein the electrical conductor is a busbar.

* * * * *